(12) United States Patent
Lee et al.

(10) Patent No.: US 11,784,177 B2
(45) Date of Patent: Oct. 10, 2023

(54) DISPLAY DEVICE AND METHOD FOR FABRICATING THE SAME

(71) Applicant: Samsung Display Co., LTD., Yongin-si (KR)

(72) Inventors: Seung Geun Lee, Hwaseong-si (KR); Jin Wan Kim, Hwaseong-si (KR); Sang Jo Kim, Daejeon (KR); Su Jeong Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/752,620

(22) Filed: May 24, 2022

(65) Prior Publication Data

US 2023/0112256 A1 Apr. 13, 2023

(30) Foreign Application Priority Data

Oct. 13, 2021 (KR) ........................ 10-2021-0135740

(51) Int. Cl.
*H01L 25/18* (2023.01)
*H01L 27/15* (2006.01)
(Continued)

(52) U.S. Cl.
CPC ........... *H01L 25/18* (2013.01); *G09G 3/2018* (2013.01); *G09G 3/32* (2013.01); *H01L 27/156* (2013.01);
(Continued)

(58) Field of Classification Search
CPC ....... H01L 25/18; H01L 27/156; H01L 24/05; H01L 24/06; H01L 24/13; H01L 24/16;
(Continued)

(56) References Cited

U.S. PATENT DOCUMENTS

2014/0035465 A1* 2/2014 Raj .......................... G09G 3/30
315/151
2016/0070386 A1* 3/2016 Yamamoto .......... G06F 3/04166
345/174
(Continued)

FOREIGN PATENT DOCUMENTS

JP 4595198 B2 10/2010
KR 2018-0118488 A 10/2018
(Continued)

OTHER PUBLICATIONS

Wang et al., Full-color micro-LED display based on a single chip with two types of InGaN/GaN MQWs, Optics Letters, vol. 46, No. 17, Sep. 1, 2021, pp. 4358-4361.
(Continued)

*Primary Examiner* — Andrew Sasinowski
(74) *Attorney, Agent, or Firm* — Lewis Roca Rothgerber Christie LLP

(57) ABSTRACT

A display device comprises a substrate, a pixel electrode on the substrate, a light emitting element on the pixel electrode, and a common electrode layer on the light emitting element, and configured to receive a common voltage, wherein the light emitting element configured to emit a first light according to a driving current having a first current density, is configured to emit a second light according to a driving current having a second current density, and is configured to emit a third light according to a driving current having a third current density.

20 Claims, 33 Drawing Sheets

NDA: PHA, PDA1, CVA1, PDA2, CVA2

(51) Int. Cl.
*G09G 3/32* (2016.01)
*G09G 3/20* (2006.01)
*H01L 23/00* (2006.01)

(52) U.S. Cl.
CPC . *G09G 2300/0426* (2013.01); *G09G 2310/08* (2013.01); *H01L 24/05* (2013.01); *H01L 24/06* (2013.01); *H01L 24/13* (2013.01); *H01L 24/16* (2013.01); *H01L 24/48* (2013.01); *H01L 24/80* (2013.01); *H01L 24/81* (2013.01); *H01L 2224/05124* (2013.01); *H01L 2224/05573* (2013.01); *H01L 2224/05582* (2013.01); *H01L 2224/05611* (2013.01); *H01L 2224/05624* (2013.01); *H01L 2224/05644* (2013.01); *H01L 2224/05647* (2013.01); *H01L 2224/05686* (2013.01); *H01L 2224/0603* (2013.01); *H01L 2224/13082* (2013.01); *H01L 2224/13111* (2013.01); *H01L 2224/13124* (2013.01); *H01L 2224/13144* (2013.01); *H01L 2224/13147* (2013.01); *H01L 2224/13186* (2013.01); *H01L 2224/16145* (2013.01); *H01L 2224/48157* (2013.01); *H01L 2224/80801* (2013.01); *H01L 2224/81801* (2013.01); *H01L 2924/0549* (2013.01); *H01L 2924/12041* (2013.01)

(58) Field of Classification Search
CPC ......... H01L 24/48; H01L 24/80; H01L 24/81; H01L 2224/05124; H01L 2224/05573; H01L 2224/05582; H01L 2224/05611; H01L 2224/05624; H01L 2224/05644; H01L 2224/05647; H01L 2224/05686; H01L 2224/0603; H01L 2224/13082; H01L 2224/13111; H01L 2224/13124; H01L 2224/13144; H01L 2224/13147; H01L 2224/13186; H01L 2224/16145; H01L 2224/48157; H01L 2224/80801; H01L 2224/81801; H01L 2924/0549; H01L 2924/12041; G09G 3/2018; G09G 3/32; G09G 2300/0426; G09G 2310/08

See application file for complete search history.

(56) References Cited

U.S. PATENT DOCUMENTS

| | | | |
|---|---|---|---|
| 2017/0186355 | A1* | 6/2017 | Takahashi ........... H01L 27/1255 |
| 2020/0227255 | A1 | 7/2020 | Zhu et al. |
| 2020/0328327 | A1 | 10/2020 | He et al. |
| 2021/0057601 | A1 | 2/2021 | Oliver et al. |
| 2021/0264848 | A1* | 8/2021 | Yamashita ........... G09G 3/2011 |
| 2022/0115564 | A1 | 4/2022 | Jeon et al. |
| 2022/0352238 | A1 | 11/2022 | Kim et al. |

FOREIGN PATENT DOCUMENTS

| | | |
|---|---|---|
| KR | 10-1968592 B1 | 4/2019 |
| KR | 2021-0005454 A | 1/2021 |
| KR | 10-2022-0149880 A | 11/2022 |

OTHER PUBLICATIONS

Baek et al., Monolithic Multi-Color Tunable Inorganic Light-Emitting Diodes, Research Article, Advanced Electronic Materials, 2021, 9 pages.

\* cited by examiner

NDA: PHA, PDA1, CVA1, PDA2, CVA2

FIG. 2
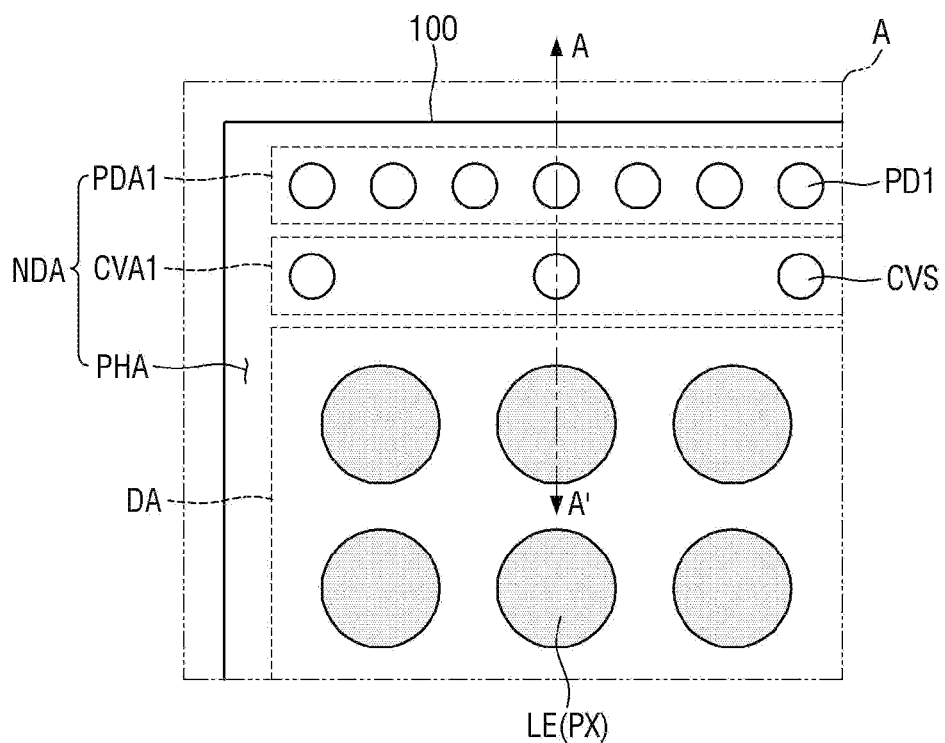
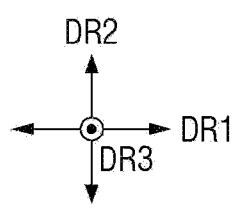

FIG. 4
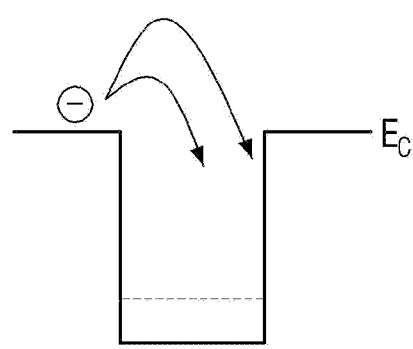
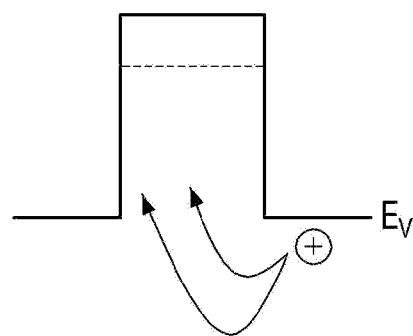

DISPLAY DEVICE AND METHOD FOR FABRICATING THE SAME

CROSS-REFERENCE TO RELATED APPLICATION

This application claims priority to, and the benefit of, Korean Patent Application No. 10-2021-0135740 filed on Oct. 13, 2021, in the Korean Intellectual Property Office (KIPO), the entire content of which is incorporated by reference herein.

BACKGROUND

1. Field

The present disclosure relates to a display device and a method for fabricating the same.

2. Description of the Related Art

With the advance of information-oriented society, more and more demands are placed on display devices for displaying images in various ways. The display device may be a flat panel display device, such as a liquid crystal display, a field emission display, and a light emitting display. A light emitting display device may include an organic light emitting display device including an organic light emitting diode element as a light emitting element, an inorganic light emitting display device including an inorganic semiconductor element as a light emitting element, or a micro light emitting display device an ultra-small light emitting diode element (or micro light emitting diode element) as a light emitting element.

Recently, a head mounted display including the light emitting display device has been developed. A head mounted display (HMD) is a glasses-type monitor device of virtual reality (VR) or augmented reality that is worn in the form of glasses or a helmet to form a focus at a distance close to the user's eyes.

A high-resolution micro light emitting diode display including a micro light emitting diode element is applied to the head mounted display. When the micro light emitting diode element emits a single color, a wavelength conversion layer for converting the wavelength of light emitted from the micro light emitting diode element is essential in order to allow the micro light emitting diode display to display various colors.

SUMMARY

Aspects of embodiments of the present disclosure include a micro light emitting diode element that emits light of a red wavelength band, a micro light emitting diode element that emits light of a green wavelength band, and a micro light emitting diode element that emits light of a blue wavelength band, and thus does not require a wavelength conversion layer, and a method for fabricating the micro light emitting diode and/or a display device including the same.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a substrate, a pixel electrode on the substrate, a light emitting element on the pixel electrode, and a common electrode layer on the light emitting element, and configured to receive a common voltage, wherein the light emitting element configured to emit a first light according to a driving current having a first current density, is configured to emit a second light according to a driving current having a second current density, and is configured to emit a third light according to a driving current having a third current density.

One frame period may include a first period, a second period, and a third period, wherein the driving current is applied at the first current density during the first period, is applied at the second current density during the second period, and is applied at the third current density during the third period.

When the light emitting element emits light with a peak white grayscale, a length of the first period may be longer than a length of the second period, and the length of the second period may be longer than a length of the third period.

The first current density may be less than the second current density, wherein the first light has a longer wavelength than the second light.

The second current density may be less than the third current density, wherein the second light has a longer wavelength than the third light.

The first light may be light of a red wavelength band, the second light may be light of a green wavelength band, and the third light may be light of a blue wavelength band.

An active layer of the light emitting element may include InGaN having an indium (In) content of about 30% to about 45%.

A first peak current value of the driving current during the first period may be lower than a second peak current value of the driving current during the second period.

A second peak current value of the driving current during the second period may be lower than a third peak current value of the driving current during the third period.

The first current density of the driving current may be constant during the first period, the second current density of the driving current may be constant during the second period, and the third current density of the driving current may be constant during the third period.

The first period, the second period, and the third period may be adjusted according to a grayscale of the light emitting element.

One frame period may include R (R being an integer greater than or equal to 2) first periods, Q (Q being an integer greater than or equal to 2) second periods, and P (P being an integer greater than or equal to 2) third periods, wherein the driving current is applied at the first current density during the first periods, is applied at the second current density during the second periods, and is applied at the third current density during the third periods.

In the one frame period, a sum of the first periods may be longer than a sum of the second periods, and the sum of the second periods may be longer than a sum of the third periods.

According to one or more embodiments of the present disclosure, there is provided a display device including a substrate, pixel electrodes on the substrate, light emitting elements respectively on the pixel electrodes, and a common electrode layer on the light emitting elements, and configured to receive a common voltage, wherein each of the light emitting elements includes a first light emitting element configured to emit a first light according to a first driving current having a first current density, and configured to emit a second light according to a first driving current having a second current density, and a second light emitting element configured to emit a third light according to a second driving current.

One frame period may include a first period and a second period, wherein the driving current is configured to be applied at the first current density during the first period, and is configured to be applied at the second current density during the second period.

When the first light emitting element emits light with a peak luminance, a length of the first period may be longer than a length of the second period.

The first current density may be less than the second current density, and the first light may have a longer wavelength than the second light.

An area of the first light emitting element may be larger than an area of the second light emitting element.

An active layer of the first light emitting element may include InGaN having an indium (In) content of about 30% to about 45%, wherein an active layer of the second light emitting element includes InGaN having an indium (In) content of 10% to 20%.

According to one or more embodiments of the present disclosure, there is provided a method for fabricating a display device, the method including forming a common electrode layer on a substrate, forming a hard mask on the common electrode layer, etching the hard mask to form openings exposing the common electrode layer, forming light emitting elements in the openings, respectively, removing the hard mask, forming first connection electrodes on the light emitting elements, respectively, forming second connection electrodes on pixel electrodes of a semiconductor circuit board, respectively, and bonding the first connection electrodes to the second connection electrodes, wherein an active layer of each of the light emitting elements includes InGaN having an indium (In) content of about 30% to about 45%.

According to one or more embodiments of the present disclosure, there is provided a method for fabricating a display device, the method including forming a common electrode layer on a substrate, forming a hard mask on the common electrode layer, etching the hard mask to form first openings exposing the common electrode layer, forming first light emitting elements in the first openings, respectively, forming a mask pattern covering the first light emitting elements, etching the mask pattern to form second openings exposing the common electrode layer, and forming second light emitting elements in the second openings, respectively, wherein an active layer of the first light emitting element includes InGaN having an indium (In) content of about 30% to about 45%, and wherein an active layer of the second light emitting element includes InGaN having an indium (In) content of 10% to 20%.

According to the aforementioned and other embodiments of the present disclosure, each of a plurality of pixels of a display panel may include a light emitting element that emits any one of first light, second light, and third light depending on a current density, so that various colors may be displayed without the wavelength conversion layer.

According to the aforementioned and other embodiments of the present disclosure, when the light emitting layer of a light emitting element is made of InGaN having an indium content of about 30% to about 45%, the driving current applied to the light emitting layer is time-divided and applied to the light emitting element, so that the light emitting element may perform time division to emit the first light, the second light, and the third light.

According to the aforementioned and other embodiments of the present disclosure, a pixel includes a light emitting element that emits any one of the first light, the second light, and the third light depending on a current density. Accordingly, it is possible to simplify a manufacturing process and reduce a manufacturing cost compared to the case of separately forming first light emitting elements that emit the first light, second light emitting elements and fourth light emitting elements that emit the second light, and third light emitting elements that emit the third light.

According to the aforementioned and other embodiments of the present disclosure, each of the plurality of pixels of the display panel includes a first light emitting element that emits any one of first light and second light depending on the current density, and a second light emitting element that emits third light, so that various colors may be displayed without the wavelength conversion layer.

According to the aforementioned and other embodiments of the present disclosure, when the first light emitting layer of the first light emitting element is made of InGaN having an indium content of about 30% to about 45%, a first driving current applied to the first light emitting layer is time-divided and applied to the first light emitting element, so that the first light emitting element may perform time division to emit the first light and the second light.

According to the aforementioned and other embodiments of the present disclosure, a pixel includes the first light emitting element that emits any one of the first light and the second light depending on the current density, and the second light emitting element that emits the third light. Accordingly, it is possible to simplify the manufacturing process and reduce the manufacturing cost compared to the case of separately forming the first light emitting elements that emit the first light, the second light emitting elements and the fourth light emitting elements that emit the second light, and the third light emitting elements that emit the third light.

BRIEF DESCRIPTION OF THE DRAWINGS

The above and other embodiments of the present disclosure will become more apparent by describing embodiments thereof with reference to the attached drawings, in which:

FIG. 2 is a layout diagram showing in detail an example of area A of FIG. 1;

FIG. 4 is a diagram illustrating the band gap of the active layer of a light emitting element in the case of applying a driving current having a first current density;

DETAILED DESCRIPTION

Figure 1:
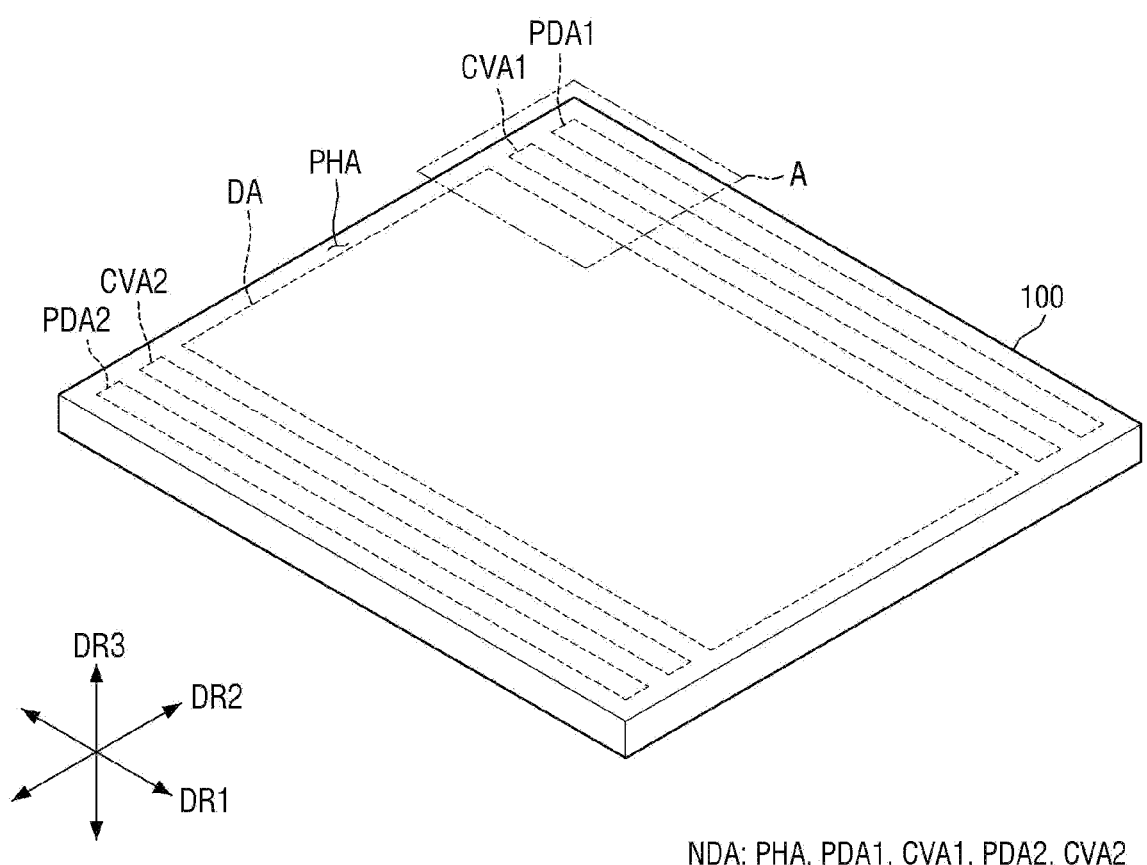
FIG. 1 is a perspective view illustrating a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of embodiments of the present disclosure to those skilled in the art. Accordingly, processes, elements, and techniques that are not necessary to those having ordinary skill in the art for a complete understanding of the aspects of embodiments of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept as well as aspects of embodiments of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element's or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to one or more embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a display device according to one or more embodiments. FIG. 2 is a layout diagram showing in detail an example of area A of FIG. 1.

Although FIGS. 1 and 2 have mainly described the case where a display device according to one or more embodiments is a micro light emitting diode display device (e.g., micro or nano light emitting diode display device) including a micro light emitting diode (e.g., micro or nano light emitting diode) as a light emitting element, the present disclosure is not limited thereto.

In addition, in FIGS. 1 and 2, the display device according to one or more embodiments is mainly described as being a light emitting diode on silicon (LEDoS) in which light emitting diodes (LED) are located as light emitting elements on a semiconductor circuit board 101 (e.g., see FIG. 3) formed by a semiconductor process using a silicon wafer, but it should be noted that the present disclosure is not limited thereto.

Further, in FIGS. 1 and 2, a first direction DR1 indicates a horizontal direction of a display panel 100, a second direction DR2 indicates a vertical direction of the display panel 100, and a third direction DR3 indicates a thickness direction of the display panel 100 or a thickness direction of the semiconductor circuit board 101. In this case, "left," "right," "upper," and "lower" indicate directions when the display panel 100 is viewed from above. For example, "right side" indicates one side of the first direction DR1, "left side" indicates the other side of the first direction DR1, "upper side" indicates one side of the second direction DR2, and "lower side" indicates the other side of the second direction DR2. Further, "upper portion" indicates one side of the third direction DR3, and "lower portion" indicates the other side of the third direction DR3.

Referring to FIGS. 1 and 2, the display device 10 according to one or more embodiments includes the display panel 100 including a display area DA and a non-display area NDA.

The display panel 100 may have a quadrilateral planar shape having long sides in the first direction DR1 and short sides in the second direction DR2. However, the planar shape of the display panel 100 is not limited thereto, and may have a polygonal shape other than a quadrilateral shape, a circular shape, an elliptical shape, or an atypical shape.

The display area DA may be an area where an image is displayed, and the non-display area NDA may be an area where an image is not displayed. The planar shape of the display area DA may follow the planar shape of the display panel 100. FIG. 1 illustrates that the planar shape of the display area DA is a quadrilateral shape. The display area DA may be generally located at the central area of the display panel 100. The non-display area NDA may be located around the display area DA. The non-display area NDA may be located to surround the display area DA.

The display area DA of the display panel 100 may include a plurality of pixels PX. In the display area DA, the plurality of pixels PX may be arranged in the first direction DR1 and the second direction DR2. That is, the plurality of pixels PX may be arranged in a matrix.

The pixel PX may include one light emitting element LE. The pixel PX may be defined as a minimum light emitting unit capable of displaying white light by combining lights emitted from the light emitting element LE.

The light emitting element LE may emit the first light, the second light, and the third light depending on the current density of the driving current applied thereto. The first light may be light of a red wavelength band, the second light may be light of a green wavelength band, and the third light may be light of a blue wavelength band. For example, the main peak wavelength (R-peak) of the first light may be within a range of about 600 nm to about 750 nm, the main peak wavelength (G-peak) of the second light may be within a range of about 480 nm to about 560 nm, and the main peak wavelength (B-peak) of the third light may be within a range of about 370 nm to about 460 nm, but the present disclosure is not limited thereto.

The light emitting element LE may have a circular planar shape as shown in FIG. 2, but the present disclosure is not limited thereto. For example, the light emitting element LE may have a polygonal shape, such as a triangular shape, a quadrilateral shape, a pentagonal shape, a hexagonal shape, and an octagonal shape, an elliptical shape, or an atypical shape.

The non-display area NDA may include a first common voltage supply area CVA1, a second common voltage supply area CVA2, a first pad area PDA1, a second pad area PDA2, and a peripheral area PHA.

The first common voltage supply area CVA1 may be located between the first pad area PDA1 and the display area DA. The second common voltage supply area CVA2 may be located between the second pad area PDA2 and the display area DA. Each of the first common voltage supply area CVA1 and the second common voltage supply area CVA2 may include a plurality of common electrode connection portions CVS connected to a common electrode layer CEL (see FIG. 9). A common voltage may be supplied to the common electrode layer CEL through the plurality of common electrode connection portions CVS.

The plurality of common electrode connection portions CVS of the first common voltage supply area CVA1 may be electrically connected to any one of first pads of the first pad area PDA1. That is, the plurality of common electrode connection portions CVS of the first common voltage supply area CVA1 may receive a common voltage from any one of the first pads of the first pad area PDA1.

The plurality of common electrode connection portions CVS of the second common voltage supply area CVA2 may be electrically connected to any one of second pads of the second pad area PDA2. That is, the plurality of common electrode connection portions CVS of the second common voltage supply area CVA2 may receive a common voltage from any one of the second pads of the second pad area PDA2.

The first pad area PDA1 may be located on the upper side of the display panel 100. The first pad area PDA1 may include the first pads to be connected to an external circuit board.

The second pad area PDA2 may be located on the lower side of the display panel 100. The second pad area PDA2 may include the second pads to be connected to the external circuit board. The second pad area PDA2 may be omitted in other embodiments.

The peripheral area PHA may be the area not including the first common voltage supply area CVA1, the second common voltage supply area CVA2, the first pad area PDA1, and the second pad area PDA2 in the non-display area NDA. The peripheral area PHA may be located to surround not only the display area DA, but also the first common voltage supply area CVA1, the second common voltage supply area CVA2, the first pad area PDA1, and the second pad area PDA2.

Figure 3:
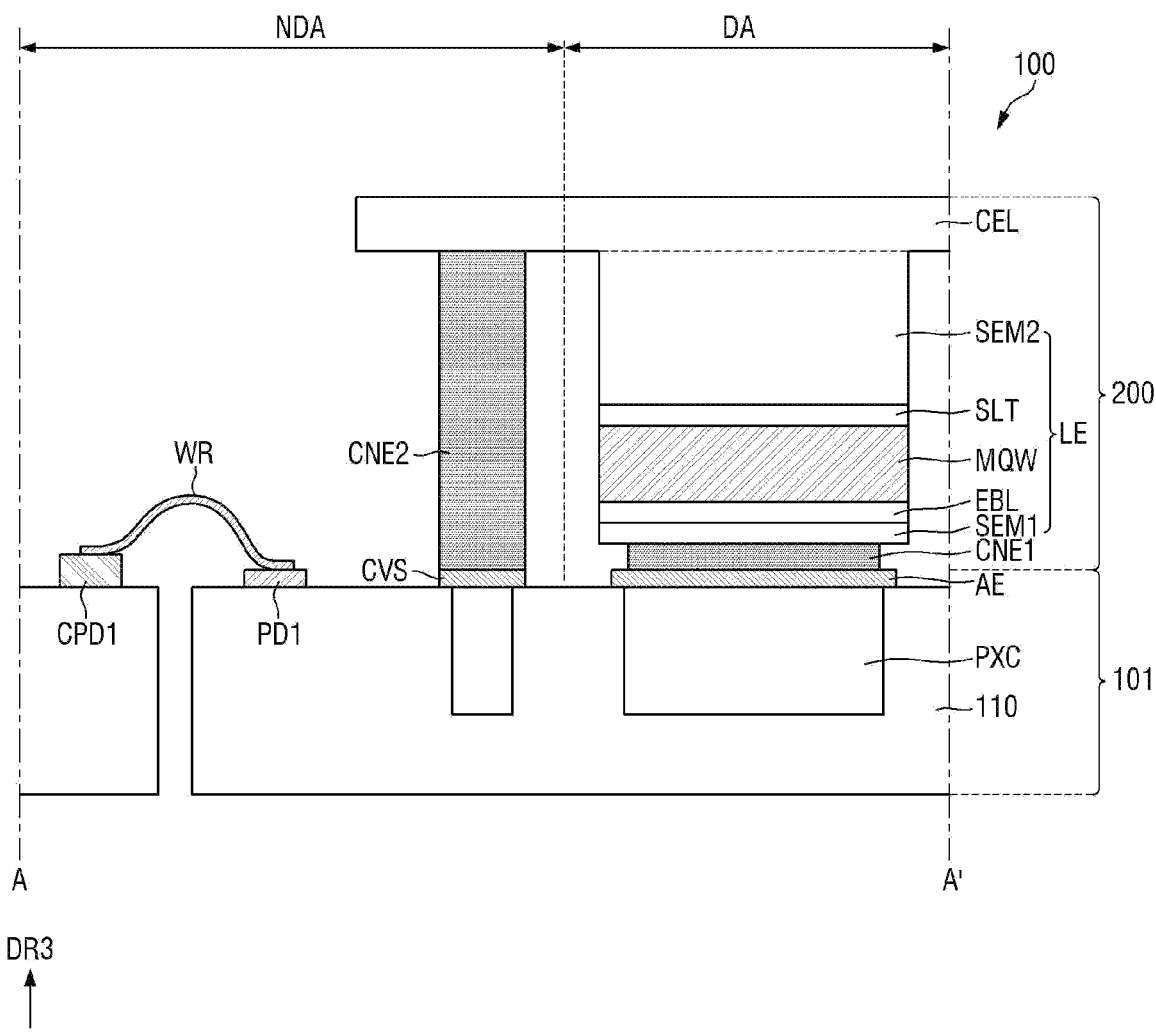
FIG. 3 is a cross-sectional view illustrating an example of a display panel taken along line A-A' of FIG. 2.

FIG. 3 is a cross-sectional view illustrating an example of a display panel taken along line A-A' of FIG. 2.

Referring to FIG. 3, the display panel 100 according to one or more embodiments may include the semiconductor circuit board 101 and a light emitting element layer 200.

The semiconductor circuit board 101 may include a first substrate 110, a plurality of pixel circuit units PXC, pixel electrodes AE, the common electrode connection portion CVS, and the first pad PD1.

The first substrate 110 may be a silicon wafer substrate. The first substrate 110 may be made of monocrystalline silicon.

Each of the plurality of pixel circuit units PXC may be located on the first substrate 110. Each of the plurality of pixel circuit units PXC may include a complementary metal-oxide semiconductor (CMOS) circuit formed by the semiconductor process. Each of the plurality of pixel circuit units PXC may include at least one transistor formed by the semiconductor process. Further, each of the plurality of pixel circuit units PXC may further include at least one capacitor formed by the semiconductor process.

The plurality of pixel circuit units PXC may be located in the display area DA. Among the plurality of pixel circuit units PXC, each of the pixel circuit units PXC located in the display area DA may be electrically connected to a pixel electrode AE corresponding thereto. That is, the plurality of pixel circuit units PXC and the plurality of pixel electrodes AE may be connected in a one-to-one correspondence. Each of the plurality of pixel circuit units PXC may apply a pixel voltage to the respective pixel electrode AE.

The plurality of pixel electrodes AE may be located in the display area DA. Each of the plurality of pixel electrodes AE may be located on a pixel circuit unit PXC corresponding thereto. Each of the pixel electrodes AE may be an exposed electrode that is formed integrally with the pixel circuit unit PXC and exposed from the pixel circuit unit PXC. That is, each of the pixel electrodes AE may protrude from the top surface of the pixel circuit unit PXC. Each of the pixel electrodes AE may receive a pixel voltage from the pixel circuit unit PXC. The pixel electrodes AE may contain a metal material such as aluminum (Al).

The plurality of common electrode connection portions CVS may be located in common electrode areas CPA1 and CPA2 of the non-display area NDA. Each of the plurality of common electrode connection portions CVS may be located on a pixel circuit unit PXC corresponding thereto. The common electrode connection portion CVS may be an exposed electrode integrally formed with the pixel circuit unit PXC and exposed from the pixel circuit unit PXC. That is, each of the common electrode connection portions CVS may protrude from the top surface of the pixel circuit unit PXC. The common electrode connection portion CVS may contain a metal material such as aluminum (Al).

The plurality of first pads PD1 may be located in the first pad area PDA1 of the non-display area NDA. Each of the plurality of first pads PD1 may be connected to a circuit pad CPD1 of a circuit board 700 through a conductive connection member, such as a wire WR. That is, the first pad PD1 and the circuit pad CPD1 of the circuit board 700 may be electrically connected to each other through the wire WR.

In one or more embodiments, the semiconductor circuit board 101 and the circuit board 700 may be located on a separate lower substrate. The semiconductor circuit board 101 and the circuit board 700 may be attached to the top surface of the lower substrate using an adhesive member such as a pressure sensitive adhesive.

The circuit board 700 may be a flexible printed circuit board (FPCB), a printed circuit board (PCB), a flexible printed circuit (FPC), or a flexible film such as a chip on film (COF).

The light emitting element layer 200 may include light emitting elements LE, the common electrode layer CEL, and connection electrodes CNE1 and CNE2.

Each of the light emitting elements LE may be located on a pixel electrode AE corresponding thereto. Each of the light emitting elements LE may extend in the third direction DR3 (e.g., the thickness direction of the first substrate 110). The length of each of the light emitting elements LE in the third direction DR3 may be longer than the length thereof in the horizontal direction. The length in the horizontal direction may be the length in the first direction DR1 or the second direction DR2. For example, the length of each of the light emitting elements LE in the third direction DR3 may be about 1 μm to about 5 μm. Each of the light emitting elements LE may have a cylindrical shape that is greater in width than in height, a disc shape, or a rod shape. However, the present disclosure is not limited thereto, and each of the light emitting elements LE may have various shapes, such as a rod shape, a wire shape, a tube shape, a polygonal prism shape such as a regular cube, a rectangular parallelepiped, and a hexagonal prism, or a shape extending in one direction and having a partially inclined outer surface.

In accordance with one or more embodiments, each of the light emitting elements LE may include a first semiconductor layer SEM1, an electron blocking layer EBL, an active layer MQW, a superlattice layer SLT, and a second semiconductor layer SEM2. The first semiconductor layer SEM1, the electron blocking layer EBL, the active layer MQW, the superlattice layer SLT, and the second semiconductor layer SEM2 may be sequentially stacked in the third direction DR3.

The first semiconductor layer SEM1 may be a p-type semiconductor, and may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of p-type doped AlGaInN, GaN, AlGaN, InGaN, AlN, and InN. The first semiconductor layer SEM1 may be doped with a p-type dopant, and the p-type dopant may be Mg, Zn, Ca, Ba, or the like. For example, the first semiconductor layer SEM1 may be p-GaN doped with p-type Mg. The first semiconductor layer SEM1 may have a thickness within a range of about 30 nm to about 200 nm.

The electron blocking layer EBL may be located on the first semiconductor layer SEM1. The electron blocking layer EBL may reduce or prevent electrons flowing into the active layer MQW from being injected into another layer without being recombined with holes in the active layer MQW. For example, the electron blocking layer EBL may be p-AlGaN doped with p-type Mg. The thickness of the electron blocking layer EBL may be within a range of about 10 nm to about 50 nm, but the present disclosure is not limited thereto. In some embodiments, the electron blocking layer EBL may be omitted.

The active layer MQW may be located on the electron blocking layer EBL. The active layer MQW may emit light due to recombination of the electrons and the holes in response to the light emitting signal applied through the first semiconductor layer SEM1 and the second semiconductor layer SEM2. The active layer MQW may include a material having a single or multiple quantum well structure. When the active layer MQW includes a material having a multiple quantum well structure, the active layer MQW may have a quantum well structure in which a plurality of well layers and barrier layers are alternately stacked. At this time, the well layer may be formed of InGaN, and the barrier layer may be formed of GaN or AlGaN, but the present disclosure is not limited thereto. For example, the active layer MQW may have a structure in which semiconductor materials having large band gap energy and semiconductor materials having small band gap energy are alternately stacked, and may include other group III to V semiconductor materials according to the wavelength band of the emitted light.

The superlattice layer SLT is located on the active layer MQW. The superlattice layer SLT may reduce stress due to the difference in lattice constant between the second semiconductor layer SEM2 and the active layer MQW. For example, the superlattice layer SLT may be formed of InGaN or GaN. The thickness of the superlattice layer SLT may be about 50 nm to about 200 nm. However, the superlattice layer SLT may be omitted.

The second semiconductor layer SEM2 may be located on the superlattice layer SLT. The second semiconductor layer SEM2 may be an n-type semiconductor. The second semiconductor layer SEM2 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of n-type doped AlGaInN, GaN, AlGaN, InGaN, AlN, and InN. The second semiconductor layer SEM2 may be doped with an n-type dopant, and the n-type dopant may be Si, Ge, Sn, or the like. For example, the second semiconductor layer SEM2 may be n-GaN doped with n-type Si. The thickness of the second semiconductor layer SEM2 may be within a range of about 500 nm to about 1 µm, but the present disclosure is not limited thereto.

In accordance with one or more embodiments, when the active layer MQW of each of the light emitting elements LE is made of InGaN, the color of the light emitted from the active layer MQW may vary depending on the content of indium (In). For example, as the content of indium (In) increases, the wavelength band of the light emitted from the active layer MQW may be shifted to a red wavelength band, and as the content of indium (In) decreases, the wavelength band of the light emitted from the active layer MQW may be shifted to a blue wavelength band. The content of indium (In) in the active layer MQW may be about 30% to about 45%. In this case, when a driving current having a high current density is applied, the active layer MQW may emit light of a short wavelength (e.g., the third light). When a driving current having a low current density is applied, the active layer MQW may emit light of a long wavelength (e.g., the first light). That is, the active layer MQW may emit any one of the first light, the second light, and the third light depending on the current density of the driving current.

Although FIG. 3 illustrates that each of the light emitting elements LE has a rectangular cross-sectional shape whose top surface and bottom surface have the same width, the present disclosure is not limited thereto. For example, the width of the top surface of each of the light emitting elements LE may be greater than the width of the bottom surface thereof. That is, each of the light emitting elements LE may have a trapezoidal cross-sectional shape. In this case, because the area of the active layer MQW of each of the light emitting elements LE increases, the amount of light emitted from each of the light emitting elements LE may increase.

The common electrode layer CEL may be located on the light emitting elements LE. The common electrode layer CEL may be connected as one common layer to the second semiconductor layer SEM2 of each of the light emitting elements LE.

The common electrode layer CEL may be an n-type semiconductor containing the same material as that of the second semiconductor layer SEM2. The common electrode layer CEL may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of n-type doped AlGaInN, GaN, AlGaN, InGaN, AlN, and InN. The common electrode layer CEL may be doped with an n-type dopant, and the n-type dopant may be Si, Ge, Sn, or the like. For example, the common electrode layer CEL may be n-GaN doped with n-type Si.

Meanwhile, although FIG. 3 illustrates that the common electrode layer CEL is made of the same material as that of the second semiconductor layer SEM2 and is integrated with the second semiconductor layer SEM2, the present disclosure is not limited thereto. In some embodiments, the common electrode layer CEL may be made of a material that is different from that of the second semiconductor layer SEM2. That is, the common electrode layer CEL may be formed as a separate layer integrated with the second semiconductor layer SEM2, and may be electrically connected to the second semiconductor layer SEM2.

Each of the first connection electrodes CNE1 may be located between a light emitting element LE corresponding thereto and a corresponding pixel electrode AE in the display area DA. Each of the first connection electrodes CNE1 may be in contact with one surface of the first semiconductor layer SEM1 of a light emitting element LE corresponding thereto. Each of the first connection electrodes CNE1 may be in contact with one surface of a pixel electrode AE corresponding thereto. Each of the first connection electrodes CNE1 may transmit the pixel voltage applied to the pixel electrode AE to the light emitting element LE. The width of the first connection electrode CNE1 may be less than the width of the light emitting element LE, but the present disclosure is not limited thereto.

The first connection electrode CNE1 may serve as a bonding metal for bonding the pixel electrode AE and the light emitting element LE to each other during a manufacturing process. The first connection electrode CNE1 may contain a material that may be electrically connected to the pixel electrode AE and the light emitting element LE. For example, the first connection electrode CNE1 may contain at least one of gold (Au), copper (Cu), aluminum (Al), or tin (Sn), or a transparent conductive oxide such as indium tin oxide (ITO) or indium zinc oxide (IZO). Alternatively, the first connection electrode CNE1 may include a first layer containing any one of gold (Au), copper (Cu), aluminum (Al), and tin (Sn), and a second layer containing another one of gold (Au), copper (Cu), aluminum (Al), and tin (Sn).

The second connection electrode CNE2 may be connected to a common electrode connection portion CVS corresponding thereto. The second connection electrode CNE2 may be located on the common electrode connection portion CVS. The second connection electrode CNE2 may extend in the third direction DR3, and may be connected to the common electrode layer CEL. The height of the second connection electrode CNE2 may be substantially the same as the sum of the height of the light emitting element LE and the height of the first connection electrode CNE1.

The second connection electrode CNE2 may contain a material that may be electrically connected to the common electrode connection portion CVS. The second connection electrode CNE2 may be made of the same material as that the first connection electrode CNE1. For example, the second connection electrode CNE2 may contain at least one of gold (Au), copper (Cu), aluminum (Al), or tin (Sn). Alternatively, the second connection electrode CNE2 may include a first layer containing any one of gold (Au), copper (Cu), aluminum (Al), and tin (Sn), and a second layer containing another one of gold (Au), copper (Cu), aluminum (Al), and tin (Sn).

The second semiconductor layers SEM2 of the light emitting elements LE may be electrically connected to each other through the common electrode layer CEL. For example, the common electrode layer CEL may contain the same material as that of the second semiconductor layer SEM2, and the second semiconductor layer SEM2 of each of the light emitting elements LE may be integrally formed with the common electrode layer CEL. That is, the second semiconductor layer SEM2 of each of the light emitting elements LE may protrude from the common electrode layer CEL. The second semiconductor layers SEM2 may be spaced apart from each other.

The common electrode layer CEL may be electrically connected to the common electrode connection portion CVS of the semiconductor circuit board 101 through the second connection electrode CNE2 located in the common electrode areas CPA1 and CPA2. Accordingly, the common electrode layer CEL may receive the common voltage through the common electrode connection portion CVS of the semiconductor circuit board 101.

As shown in FIG. 3, each of the plurality of pixels PX of the display panel 100 includes the light emitting element LE that emits any one of the first light, the second light, and the third light depending on the current density, so that various colors may be displayed without a wavelength conversion layer.

Figure 5:
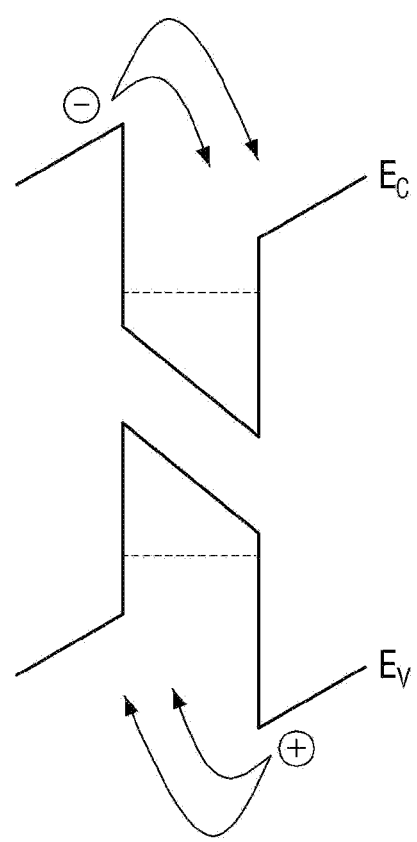
FIG. 5 is a diagram illustrating the band gap of the active layer of a light emitting element in the case of applying a driving current having a second current density.

FIG. 4 is a diagram illustrating the band gap of the active layer of a light emitting element in the case of applying a driving current having a first current density. FIG. 5 is a diagram illustrating the band gap of the active layer of a light emitting element in the case of applying a driving current having a second current density.

Referring to FIGS. 4 and 5, the active layer MQW of the light emitting element LE may be made of InGaN having an indium (In) content of about 30% to about 45%. In this case, the light emitted from the light emitting element LE may be shifted from red to blue depending on the current density. For example, as the current density increases, the band gap of the active layer MQW of the light emitting element LE may be changed from a rectangular shape, as shown in FIG. 4, to a trapezoidal or parallelogram shape, as shown in FIG. 5, due to a quantum-confined stark effect (QCSE). In this case, the band filling in which carriers fill the quantum well of the active layer MQW is faster when the band gap has a trapezoidal or parallelogram shape, as shown in FIG. 5, than when the band gap has a rectangular shape, as shown in FIG. 4, so that electrons and holes may be recombined at a higher energy level when the band gap has the trapezoidal shape. Therefore, as the current density applied to the active layer MQW of the light emitting element LE increases, the active layer MQW of the light emitting element LE may emit light of a short wavelength. As the current density applied to the active layer MQW of the light emitting element LE decreases, the active layer MQW of the light emitting element LE may emit light of a long wavelength.

As described above, when the active layer MQW of the light emitting element LE is made of InGaN having an indium (In) content of about 30% to about 45%, the active layer MQW may be controlled to emit short wavelength light and long wavelength light by adjusting the current density of the driving current applied to the active layer MQW. That is, in order to allow the light emitting element LE to emit the first light that is the long wavelength light, a driving current Ids having a first current density may be applied to the light emitting element LE. To allow the light emitting element LE to emit the second light, a driving current Ids having a second current density, which is higher than the first current density, may be applied to the light emitting element LE. To allow the light emitting element LE to emit the third light that is the short wavelength light, a driving current Ids having a third current density, which is higher than the second current density, may be applied to the light emitting element LE.

Figure 6:
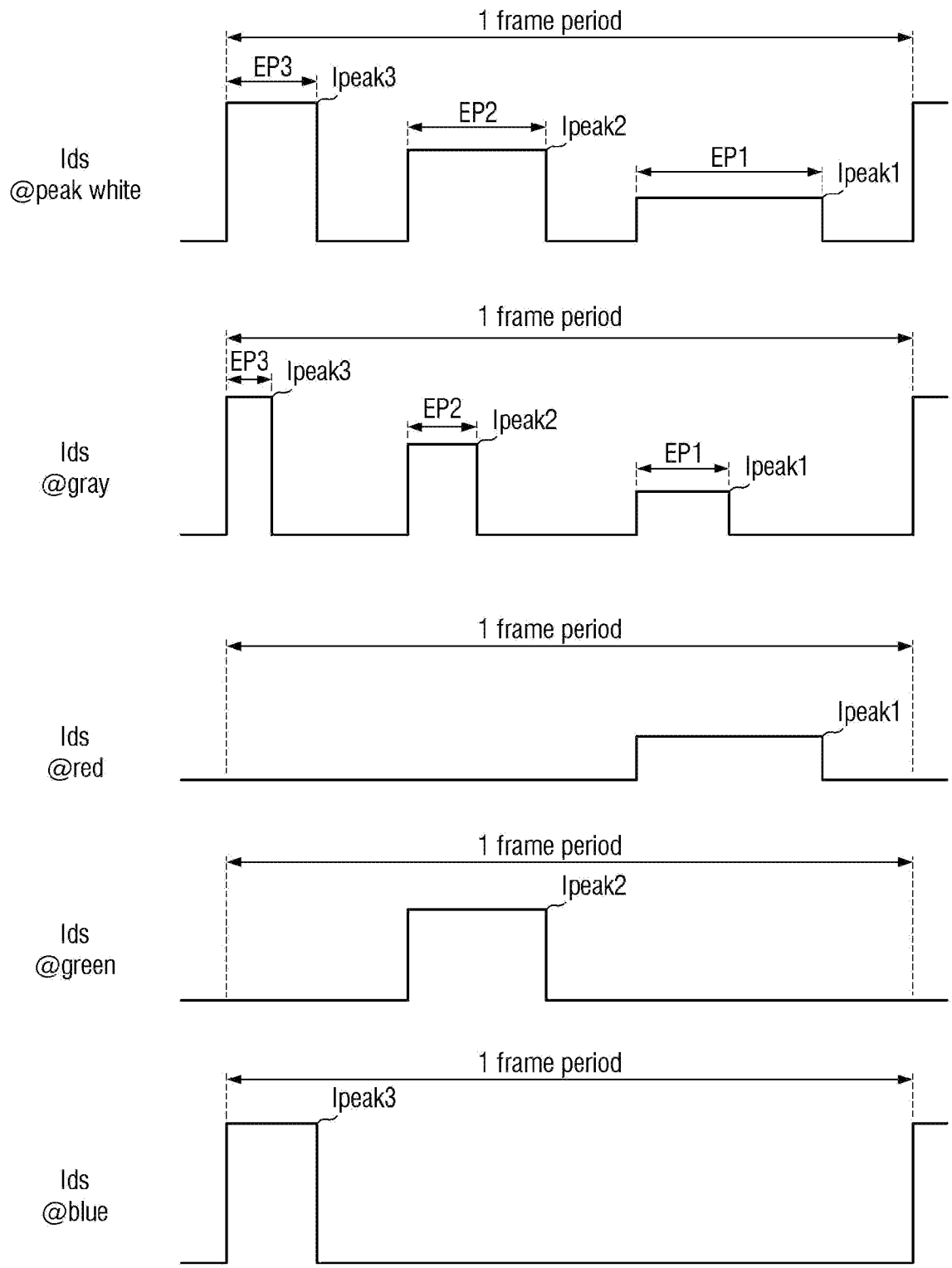
FIG. 6 is a waveform diagram illustrating a driving current according to one or more embodiments.

FIG. 6 is a waveform diagram illustrating a driving current according to one or more embodiments. FIG. 6 shows the driving current Ids applied to the light emitting element LE during one frame period. FIG. 6 shows the driving current Ids applied to the light emitting element LE in each of the case where the pixel PX expresses a peak white grayscale, the case where the pixel PX expresses a grayscale, the case where the pixel PX emits red light, the case where the pixel PX emits green light, and the case where the pixel PX emits blue light. The peak white grayscale indicates the brightest grayscale that may be expressed by the pixel PX.

Referring to FIG. 6, one frame period may include a first period EP1, a second period EP2, and a third period EP3. Although FIG. 6 illustrates that the first period EP1, the second period EP2, and the third period EP3 are arranged in the order of third period EP3, the second period EP2, and the first period EP1 in one frame period, the present disclosure is not limited thereto.

The driving current Ids may be time-divided and applied to the light emitting element LE during one frame period. For example, the driving current Ids may be applied to the light emitting element LE at the first current density during the first period EP1, may be applied to the light emitting element LE at the second current density during the second period EP2, and may be applied to the light emitting element LE at the third current density during the third period EP3. The length of the first period EP1, the length of the second period EP2, and the length of the third period EP3 may be adjusted depending on to the grayscale expressed by the pixel PX. For example, when the pixel PX expresses the peak white grayscale, the length of the first period EP1, the length of the second period EP2, and the length of the third period EP3 may be longer than those when the pixel PX expresses the grayscale. As the pixel PX expresses the peak white grayscale, the length of the first period EP1, the length of the second period EP2, and the length of the third period EP3 may increase, and as the pixel PX expresses the peak black grayscale, the length of the period EP1, the length of the second period EP2, and the length of the third period EP3 may decrease. The peak black grayscale indicates the darkest grayscale that may be expressed by the pixel PX.

When the pixel PX emits red light, the driving current Ids may be applied at the first current density only during the first period EP1. Further, when the pixel PX emits green light, the driving current Ids may be applied at the second current density only during the second period EP2. Further, when the pixel PX emits blue light, the driving current Ids may be applied at the third current density only during the third period EP3.

Because the second current density is higher than the first current density, and because the third current density is higher than the second current density, when the pixel PX expresses the peak white grayscale, the length of the first period EP1 may be longer than the length of the second period EP2, and the length of the second period EP2 may be longer than the period of the third period EP3.

Because the current density of the driving current Ids increases as the peak current value of the driving current Ids increases, a second peak current value Ipeak2 of the driving current Ids may be higher than (e.g., greater than) a first peak current value Ipeak1. Further, a third peak current value Ipeak3 of the driving current Ids may be higher than (e.g., greater than) the second peak current value Ipeak2.

As described above, when the active layer MQW of the light emitting element LE is made of InGaN having an indium (In) content of about 30% to about 45%, the light emitting element LE may perform time division to emit the first light, the second light, and the third light by performing time division on the driving current Ids applied to the active layer MQW, and by applying the driving current Ids to the light emitting element LE.

Figure 7:
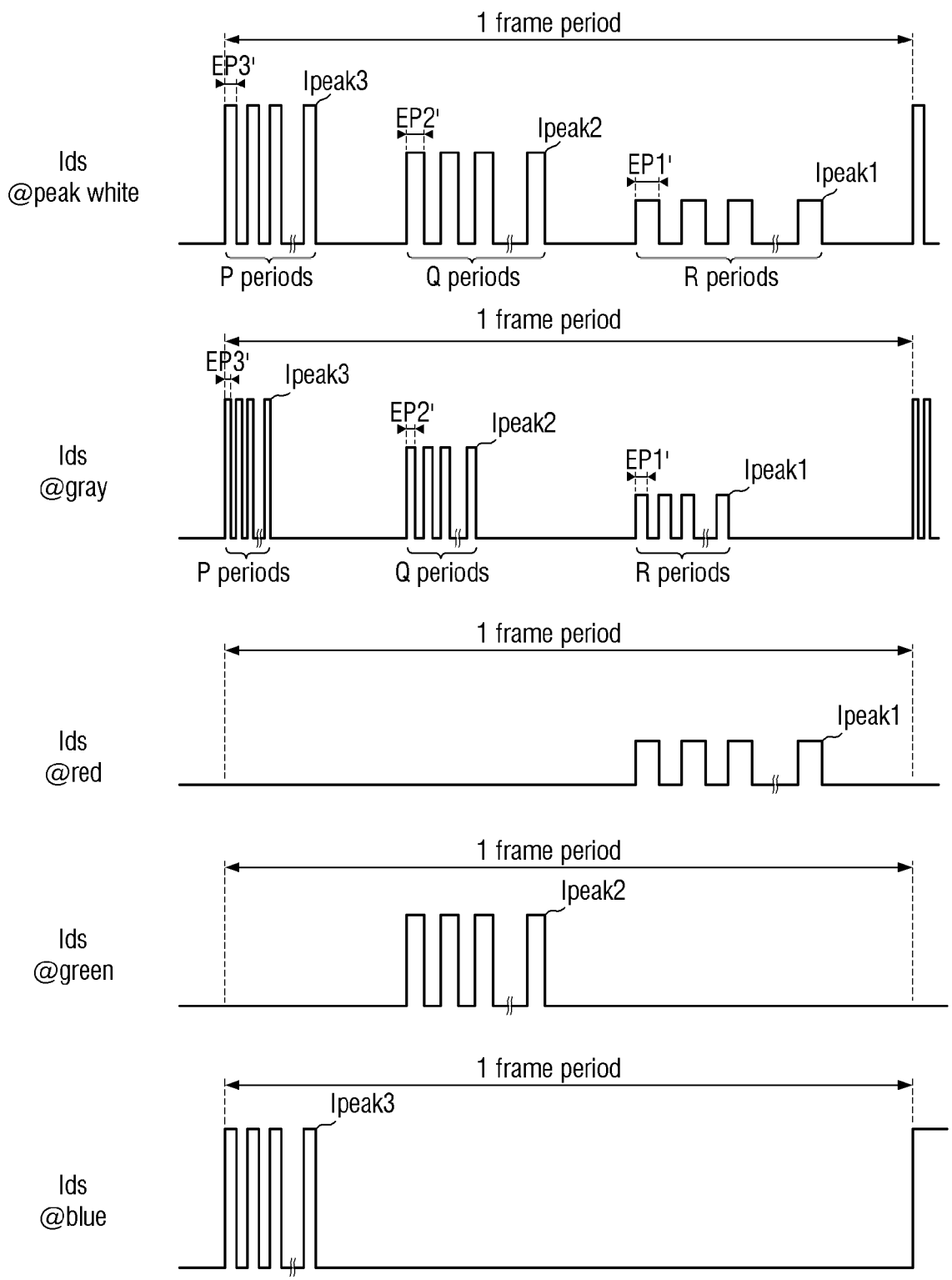
FIG. 7 is a waveform diagram illustrating a driving current applied to a light emitting element according to one or more other embodiments.

FIG. 7 is a waveform diagram illustrating a driving current applied to a light emitting element according to one or more other embodiments.

The embodiments corresponding to FIG. 7 are different from the embodiments corresponding to FIG. 6 in that the driving current Ids is applied to the light emitting element LE over a plurality of first emission periods EP1', a plurality of second emission periods EP2', and a plurality of third emission periods EP3' during one frame period. In FIG. 7, differences from the embodiments corresponding to FIG. 6 will be mainly described.

Referring to FIG. 7, one frame period may include R (R being a positive integer of 2 or more) first emission periods EP1', Q (Q being a positive integer of 2 or more) second emission periods EP2', and P (P being a positive integer of 2 or more) third emission periods EP3'. The lengths of the R first periods EP1' may be substantially the same. The lengths of the Q second emission periods EP2' may be substantially the same. The lengths of the P third emission periods EP3' may be substantially the same.

The length of the first period EP1', the length of the second period EP2', and the length of the third period EP3' may be adjusted depending on the grayscale expressed by the pixel PX. For example, when the pixel PX expresses the peak white grayscale, the length of the first period EP1', the length of the second period EP2', and the length of the third period EP3' may be longer than those when the pixel PX expresses the grayscale. As the pixel PX expresses the peak white grayscale, the length of the first period EP1', the length of the second period EP2', and the length of the third period EP3' may increase, and as the pixel PX expresses the peak black grayscale, the length of the first period EP1', the length of the second period EP2', and the length of the third period EP3' may decrease.

When the pixel PX emits red light, the driving current Ids may be applied at the first current density only during the R first periods EP1'. Further, when the pixel PX emits green light, the driving current Ids may be applied at the second current density only during the Q second periods EP2'. Further, when the pixel PX emits blue light, the driving current Ids may be applied at the third current density only during the P third periods EP3'.

Because the second current density is higher than the first current density, and because the third current density is higher than the second current density, when the pixel PX expresses the peak white grayscale, the length of the first period EP1' may be longer than the length of the second period EP2', and the length of the second period EP2' may be longer than the length of the third period EP3'. Further, when the pixel PX expresses the peak white grayscale, during one frame period, the sum of the R first periods EP1' may be longer than the sum of the Q second periods EP2', and the sum of the Q second periods EP2' may be longer than the sum of the P third periods EP3'.

Figure 8:
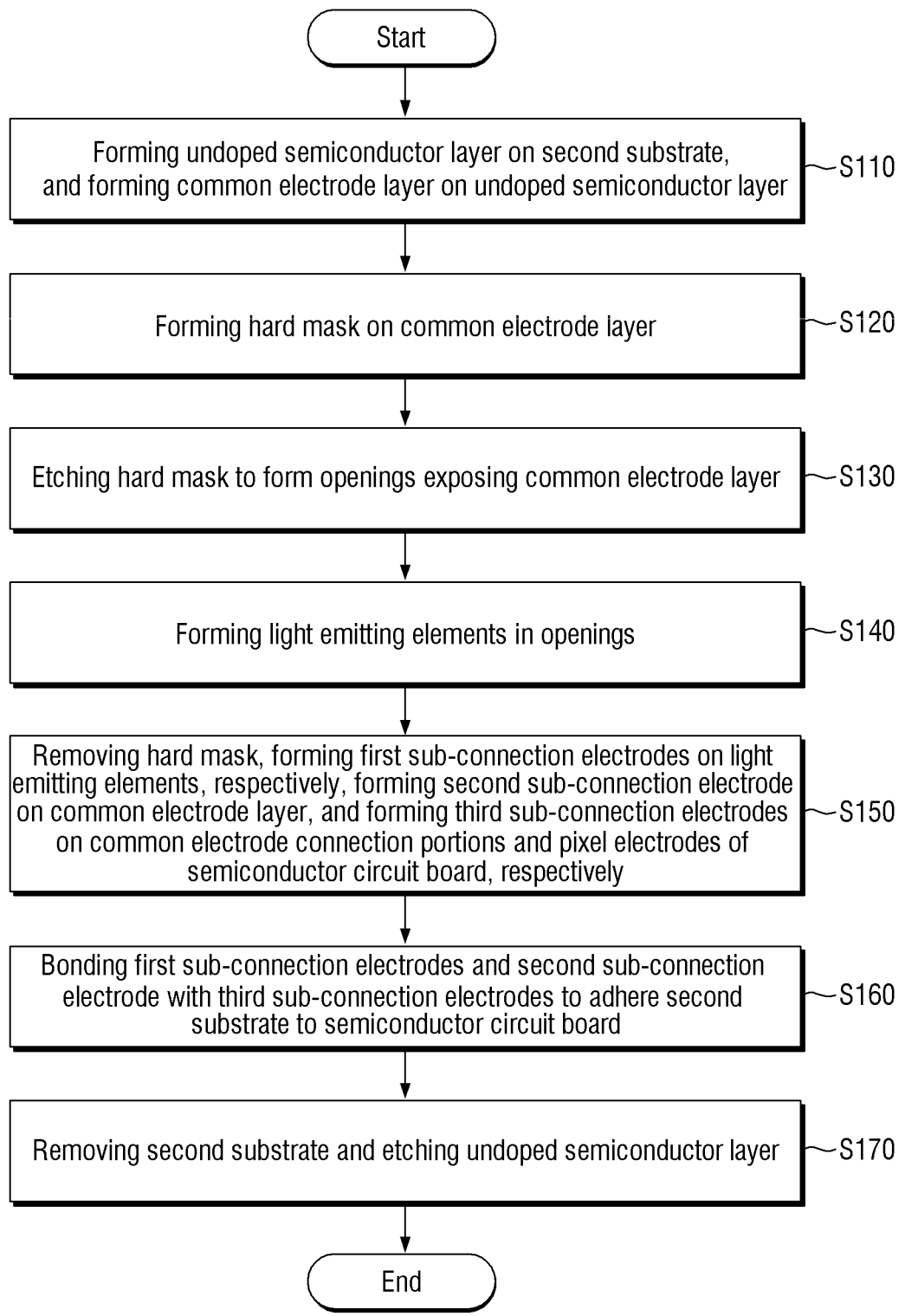
FIG. 8 is a flowchart illustrating a method for fabricating a display device according to one or more embodiments.

FIG. 8 is a flowchart illustrating a method for fabricating a display device according to one or more embodiments. FIGS. 9 to 15 are cross-sectional views illustrating a method for fabricating a display device according to one or more embodiments.

Hereinafter, a method for fabricating a display device according to one or more embodiments will be described in detail with reference to FIGS. 8 to 15.

Figure 9:
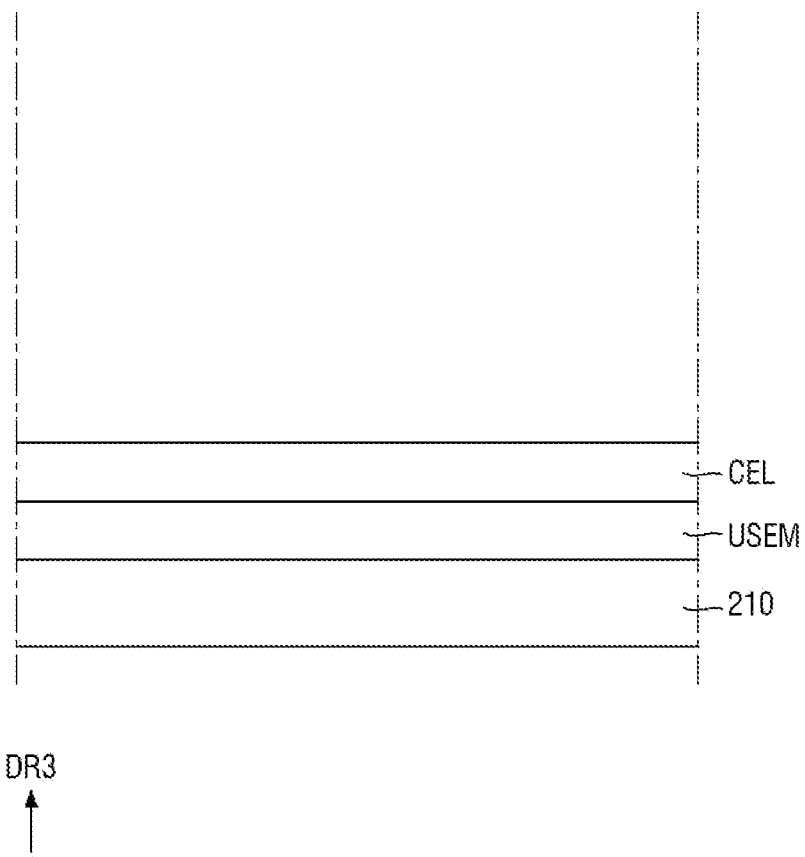
FIGS. 9 to 15 are cross-sectional views illustrating a method for fabricating a display device according to one or more embodiments.

First, as shown in FIG. 9, an undoped semiconductor layer USEM is formed on a second substrate 210, and the common electrode layer CEL is formed on the undoped semiconductor layer USEM (operation S110 in FIG. 8).

The second substrate 210 may be a sapphire substrate ($Al_2O_3$) or a silicon wafer containing silicon. However, the second substrate 210 is not limited thereto, and may be a semiconductor substrate such as a GaAs substrate or the like. Hereinafter, the case where the second substrate 210 is a sapphire substrate will be described as an example.

Figure 13:
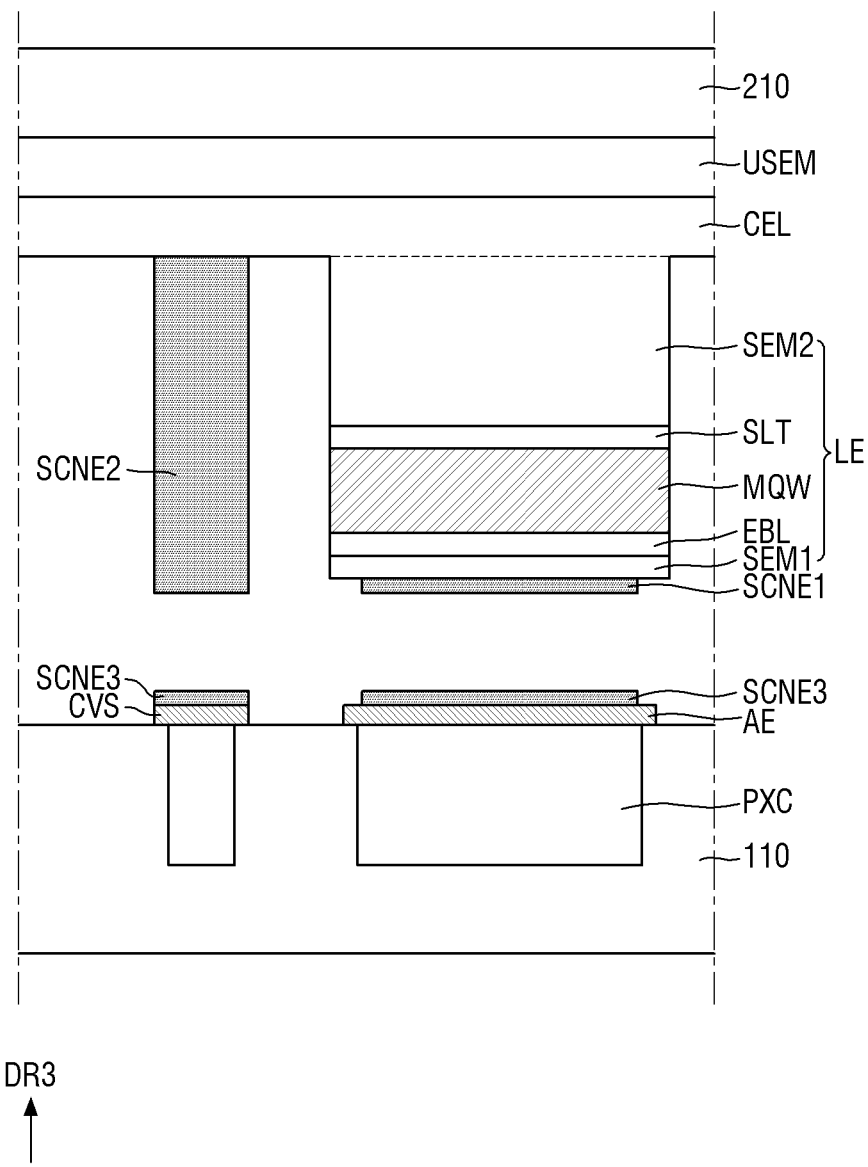

The undoped semiconductor layer USEM may include an undoped semiconductor, and may be a material that is not doped with an n-type dopant or p-type. For example, the undoped semiconductor layer USEM may be at least one of undoped InAlGaN, GaN, AlGaN, InGaN, AlN, or InN, but the present disclosure is not limited thereto. Although FIG. 13 illustrates that a single undoped semiconductor layer USEM is formed on the second substrate 210, the present disclosure is not limited thereto, and a plurality of undoped semiconductor layers USEM may be formed on the second substrate 210 in other embodiments. The undoped semiconductor layer USEM may be located to reduce a lattice constant difference between the common electrode layer CEL and the second substrate 210.

The common electrode layer CEL may include an n-type semiconductor. For example, the common electrode layer CEL may be any one or more of n-type doped AlGaInN, GaN, AlGaN, InGaN, AlN, and InN.

The undoped semiconductor layer USEM and the common electrode layer CEL may be formed by an epitaxial growth method. The epitaxial growth method may be electron beam deposition, physical vapor deposition (PVD), chemical vapor deposition (CVD), plasma laser deposition (PLD), dual-type thermal evaporation, sputtering, metal organic chemical vapor deposition (MOCVD), or the like. For example, it may be performed by the metal organic chemical vapor deposition (MOCVD), but the present disclosure is not limited thereto.

Typically, a precursor material for forming the plurality of semiconductor material layers may be selected to form a target material in a typically selectable range without any limitation. For example, the precursor material may be a metal precursor including an alkyl group such as a methyl group or an ethyl group. Examples of the precursor material may include, but are not limited to, trimethylgallium $Ga(CH_3)_3$, trimethylaluminum $Al(CH_3)_3$, and triethyl phosphate $(C_2H_5)_3PO_4$.

Figure 10:
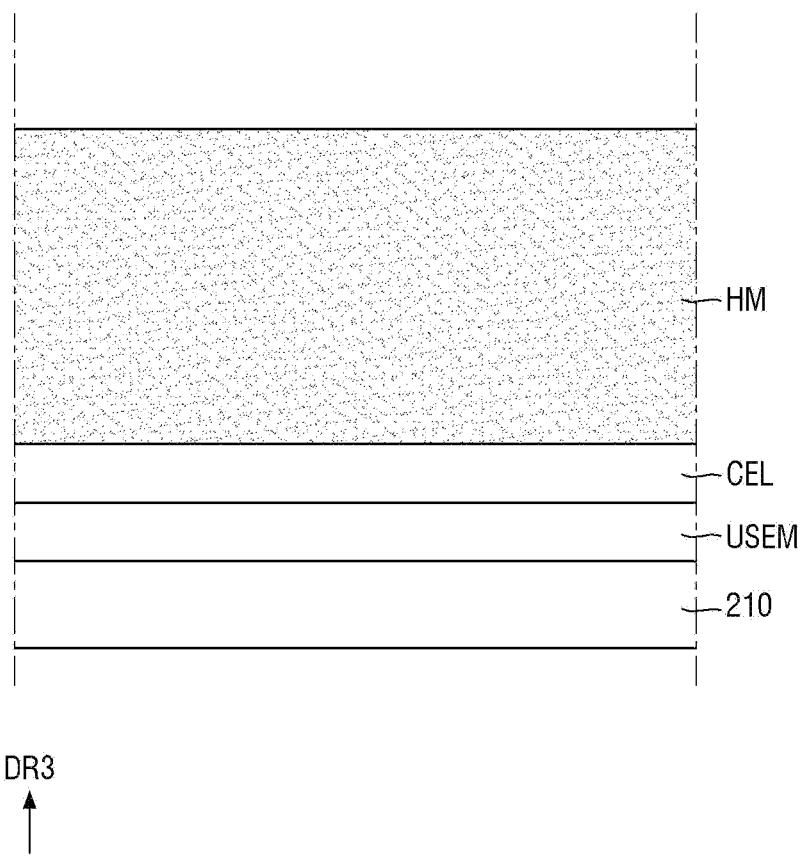

Second, as shown in FIG. 10, a hard mask HM is formed on the common electrode layer CEL (operation S120 in FIG. 8).

The hard mask HM may be located on the entire common electrode layer CEL. The hard mask HM may contain an insulating material such as silicon oxide ($SiO_x$), silicon nitride (SiN$_x$), or silicon oxynitride (SiO$_x$N$_y$). The hard mask HM may function as a mask in a process for forming the light emitting elements LE.

Figure 11:
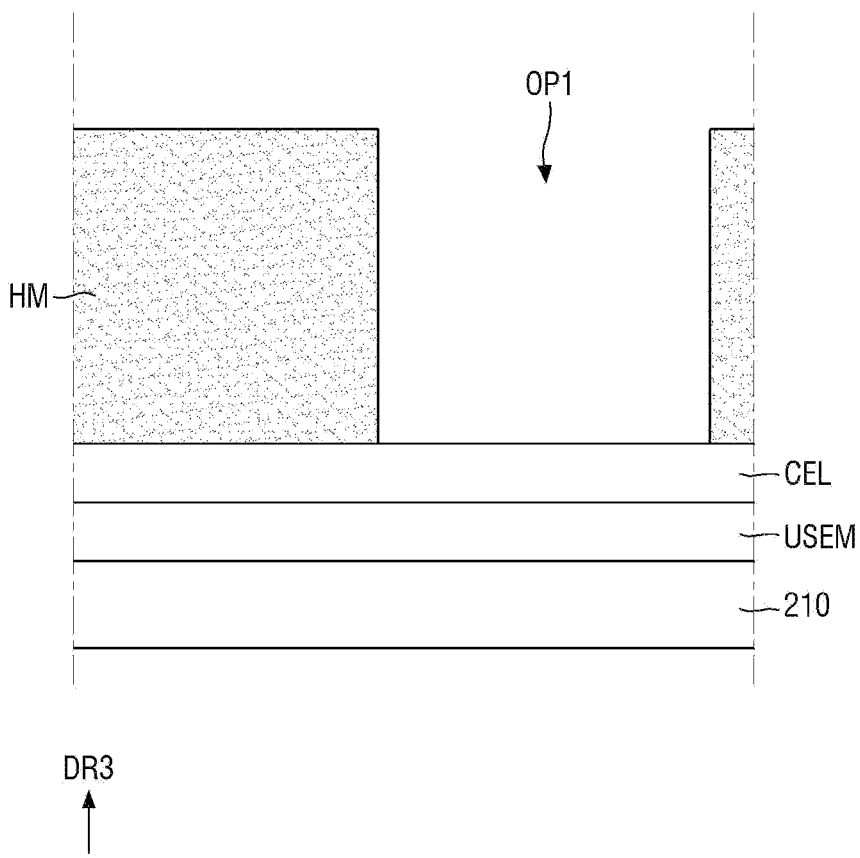

Third, as shown in FIG. 11, the hard mask HM is etched to form a plurality of openings OP exposing the common electrode layer CEL (operation S130 in FIG. 8).

The plurality of openings OP may be formed to be spaced apart from each other. The gap and width of the plurality of openings OP may be set in consideration of the arrangement and width of the light emitting elements LE.

In one or more embodiments in the drawing, a separate mask may be located on the hard mask HM excluding the region where a plurality of first openings OP1 will be formed, and the plurality of first openings OP1 may be formed by performing wet etching or dry etching of the hard mask HM.

Figure 12:
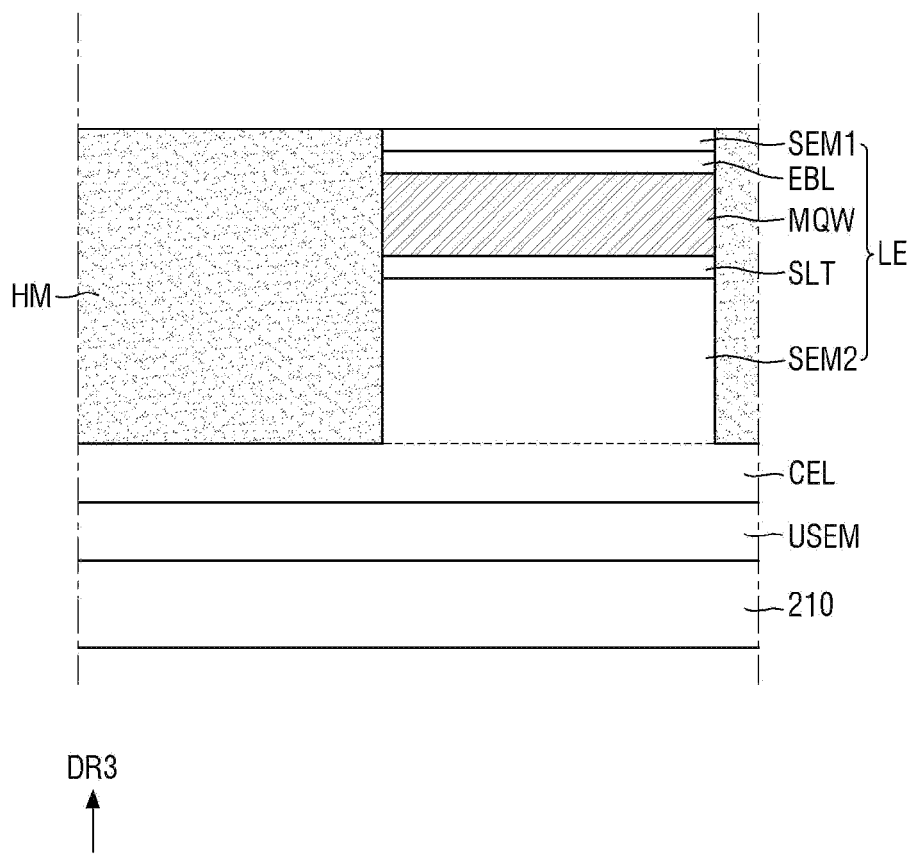

Fourth, as shown in FIG. 12, the first light emitting elements LE1 are formed in the plurality of openings OP1 (operation S140 in FIG. 8).

The process of forming the light emitting elements LE may be performed by an epitaxial growth method. When the top surface of the common electrode layer CEL is exposed by the plurality of openings OP, a semiconductor crystal is grown by injecting a precursor material onto the common electrode layer CEL. The second semiconductor layer SEM2 of each of the light emitting elements LE located on the common electrode layer CEL may contain substantially the same material as that of the common electrode layer CEL, and may be formed by the growth of the semiconductor crystal of the common electrode layer CEL. Accordingly, the second semiconductor layer SEM2 of each of the light emitting elements LE and the common electrode layer CEL may be integrated.

Then, the superlattice layer SLT, the active layer MQW, the electron blocking layer EBL, and the first semiconductor layer SEM1 are sequentially grown to complete the light emitting elements LE.

Fifth, as shown in FIG. 13, the hard mask HM is etched, first sub-connection electrodes SCNE1 are respectively formed on the light emitting elements LE, a second sub-connection electrode SCNE2 is formed on the common electrode layer CEL, and third sub-connection electrodes SCNE3 are respectively formed on the pixel electrodes AE and the common electrode connection portions CVS of the semiconductor circuit board 101 (operation S150 in FIG. 8).

The hard mask HM may be etched at one time by an etching process. The etching process may be dry etching, wet etching, reactive ion etching (RIE), deep reactive ion etching (DRIE), inductively coupled plasma reactive ion etching (ICP-RIE), or the like.

Then, the first sub-connection electrode SCNE1 may be formed on the top surface of the first semiconductor layer SEM1 of each of the light emitting elements LE by a photolithography process.

Further, the second sub-connection electrode SCNE2 may be formed on the common electrode layer CEL by the photolithography process.

Furthermore, the third sub-connection electrodes SCNE3 may be respectively formed on the pixel electrodes AE and the common electrode connection portions CVS of the semiconductor circuit board 101 by the photolithography process.

The first sub-connection electrodes SCNE1, the second sub-connection electrode SCNE2, and the third sub-connection electrodes SCNE3 may serve as a bonding metal. For example, the first sub-connection electrodes SCNE1, the second sub-connection electrode SCNE2, and the third sub-connection electrodes SCNE3 may contain at least one of gold (Au), copper (Cu), aluminum (Al), or tin (Sn), or may contain a transparent conductive oxide such as indium tin oxide (ITO) or indium zinc oxide (IZO).

Figure 14:
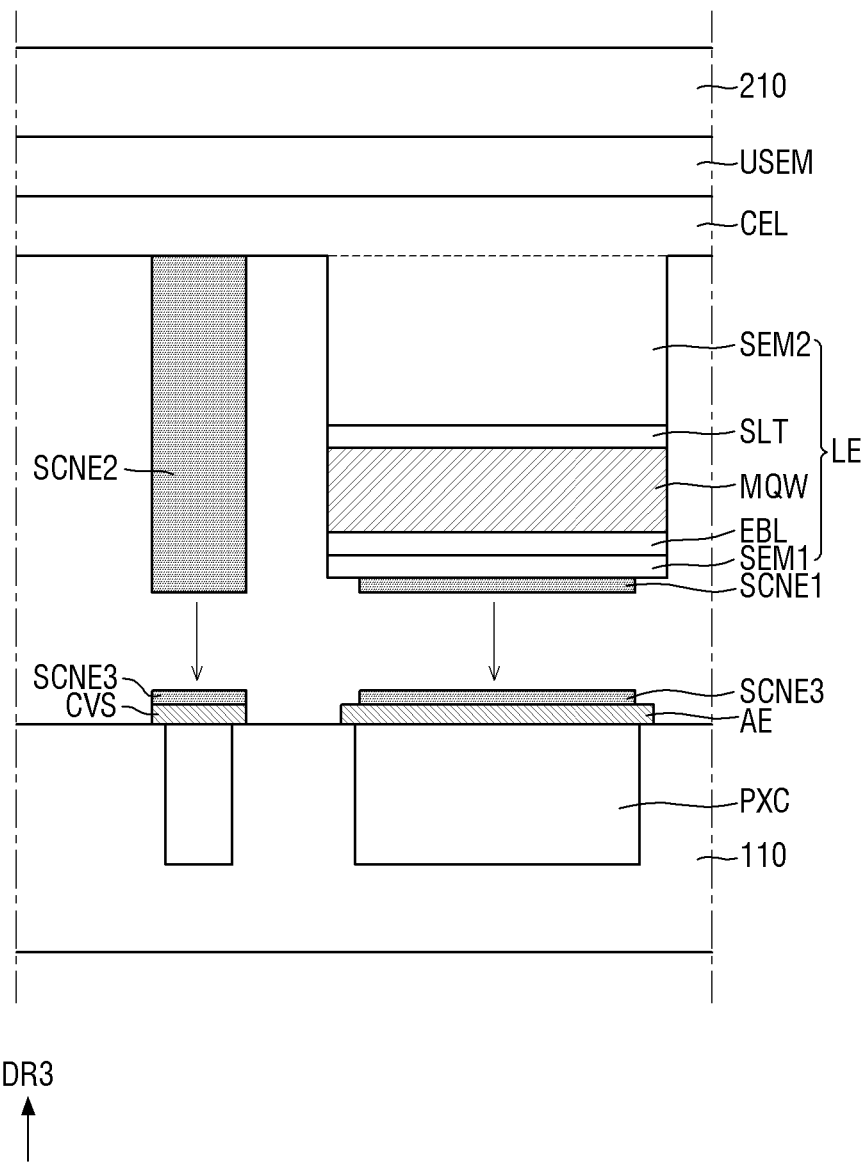

Sixth, as shown in FIG. 14, the first sub-connection electrodes SCNE1 and the second sub-connection electrode SCNE2 are respectively bonded with the third sub-connection electrodes SCNE3 to adhere the second substrate 210 to a semiconductor circuit board 101 (operation S160 in FIG. 8).

The first sub-connection electrodes SCNE1 of the second substrate 210 may be aligned to correspond to the pixel electrodes AE of the semiconductor circuit board 101, respectively. Further, the second sub-connection electrode SCNE2 of the second substrate 210 may be aligned to correspond to the common electrode connection portion CVS of the semiconductor circuit board 101. That is, the first sub-connection electrodes SCNE1 of the second substrate 210 may overlap the pixel electrodes AE of the semiconductor circuit board 101 in the third direction DR3, respectively. The second sub-connection electrode SCNE2 of the second substrate 210 may overlap the common electrode connection portions CVS of the semiconductor circuit board 101 in the third direction DR3.

Then, the first sub-connection electrodes SCNE1 and the second sub-connection electrode SCNE2 of the second substrate 210 are brought into contact with the respective third sub-connection electrodes SCNE3 of the semiconductor circuit board 101. Then, respective ones of the first sub-connection electrodes SCNE1, the second sub-connection electrode SCNE2, and the third sub-connection electrodes SCNE3 are fusion-bonded at a temperature (e.g., a predetermined temperature). Accordingly, the second substrate 210 may be adhered to the semiconductor circuit board 101.

Figure 15:
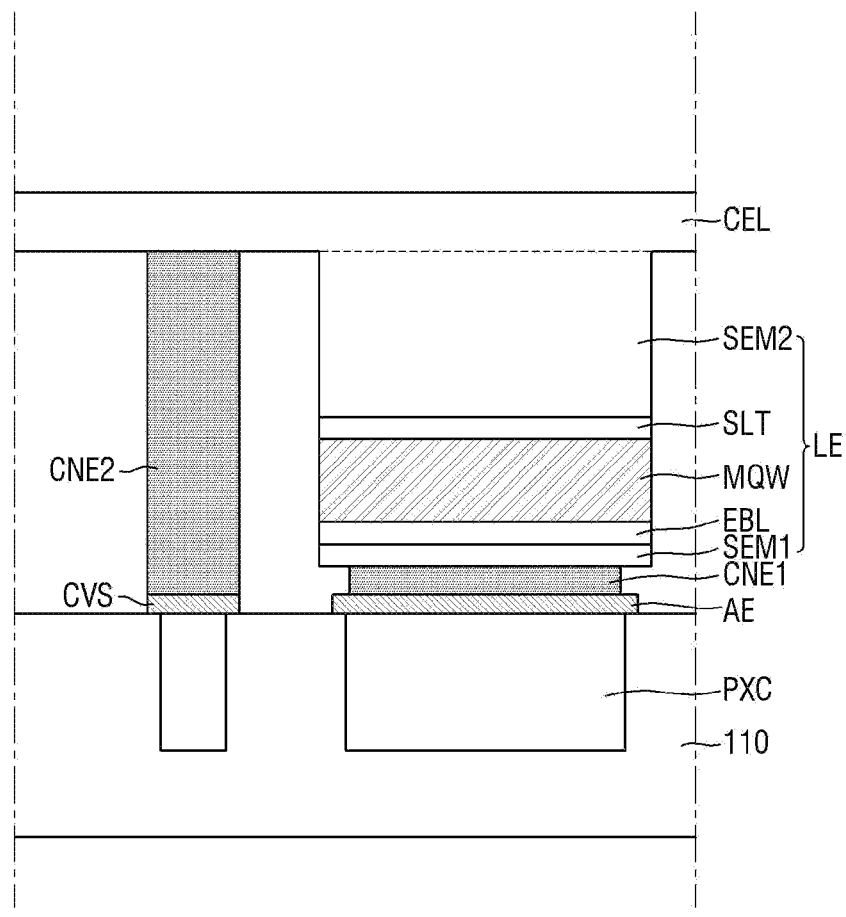

Seventh, as shown in FIG. 15, the second substrate 210 is removed, and the undoped semiconductor layer USEM is etched (operation S170 in FIG. 8).

The second substrate 210 may be separated from the undoped semiconductor layer USEM by a laser lift-off process. Alternatively, the second substrate 210 may be removed by a polishing process, such as a chemical mechanical polishing (CMP) process and/or an etching process.

The undoped semiconductor layer USEM may be removed by the polishing process, such as the CMP process, or may be removed by wet etching or dry etching. When the undoped semiconductor layer USEM is removed, a part of the common electrode layer CEL may be removed.

As described above, the pixel PX includes the light emitting element LE that emits any one of the first light, the second light, and the third light depending on the current density. Accordingly, it is possible to simplify the manufacturing process, and to reduce the manufacturing cost compared to the case of separately forming the first light emitting elements that emit the first light, the second light emitting elements that emit the second light, and the third light emitting elements that emit the third light.

Figure 16A:
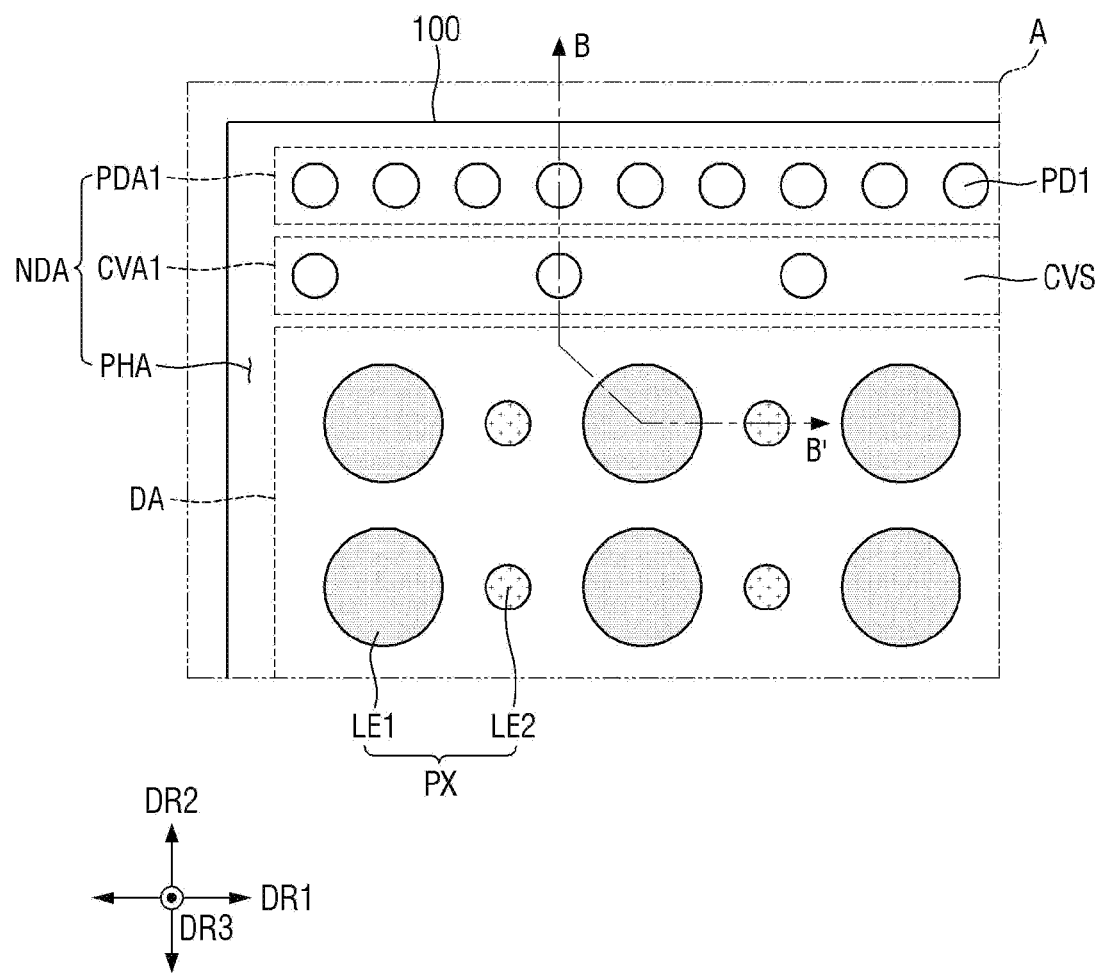
FIG. 16A is a layout diagram illustrating another example of area A of FIG. 1.

FIG. 16A is a layout diagram illustrating another example of area A of FIG. 1.

The embodiments corresponding to FIG. 16A are different from the embodiments corresponding to FIG. 2 in that each of the plurality of pixels PX includes the first light emitting element LE1 and a second light emitting element LE2. The description being made with reference to FIG. 16A is mainly directed to the differences from the embodiments corresponding to FIG. 2.

Referring to FIG. 16A, the first light emitting element LE1 may emit the first light and the second light depending on the current density of the driving current applied thereto. The second light emitting element LE2 may emit the third light.

In each of the plurality of pixels PX, the first light emitting element LE1 and the second light emitting element LE2 may be arranged in the first direction DR1 as shown in FIG. 16A, but the present disclosure is not limited thereto. In one or more embodiments, in each of the plurality of pixels PX, the first light emitting element LE1 and the second light emitting element LE2 may be arranged in the second direction DR2, or may be arranged in a diagonal direction between the first direction DR1 and the second direction DR2.

The first light emitting elements LE1 and the second light emitting elements LE2 may be alternately located in the first direction DR1. The first light emitting elements LE1 may be arranged in the second direction DR2, and the second light emitting elements LE2 may be arranged in the second direction DR2, but the present disclosure is not limited thereto.

FIG. 16A illustrates that each of the first light emitting elements LE1 and the second light emitting elements LE2 has a circular planar shape, but the present disclosure is not limited thereto. In one or more embodiments, each of the first light emitting elements LE1 and the second light emitting elements LE2 may have a polygonal shape such as a triangular shape, a quadrilateral shape, a pentagonal shape, a hexagonal shape, and an octagonal shape, an elliptical shape, or an atypical shape. Further, the planar shape of the first light emitting element LE1 and the planar shape of the second light emitting element LE2 may be different from each other.

Figure 16B:
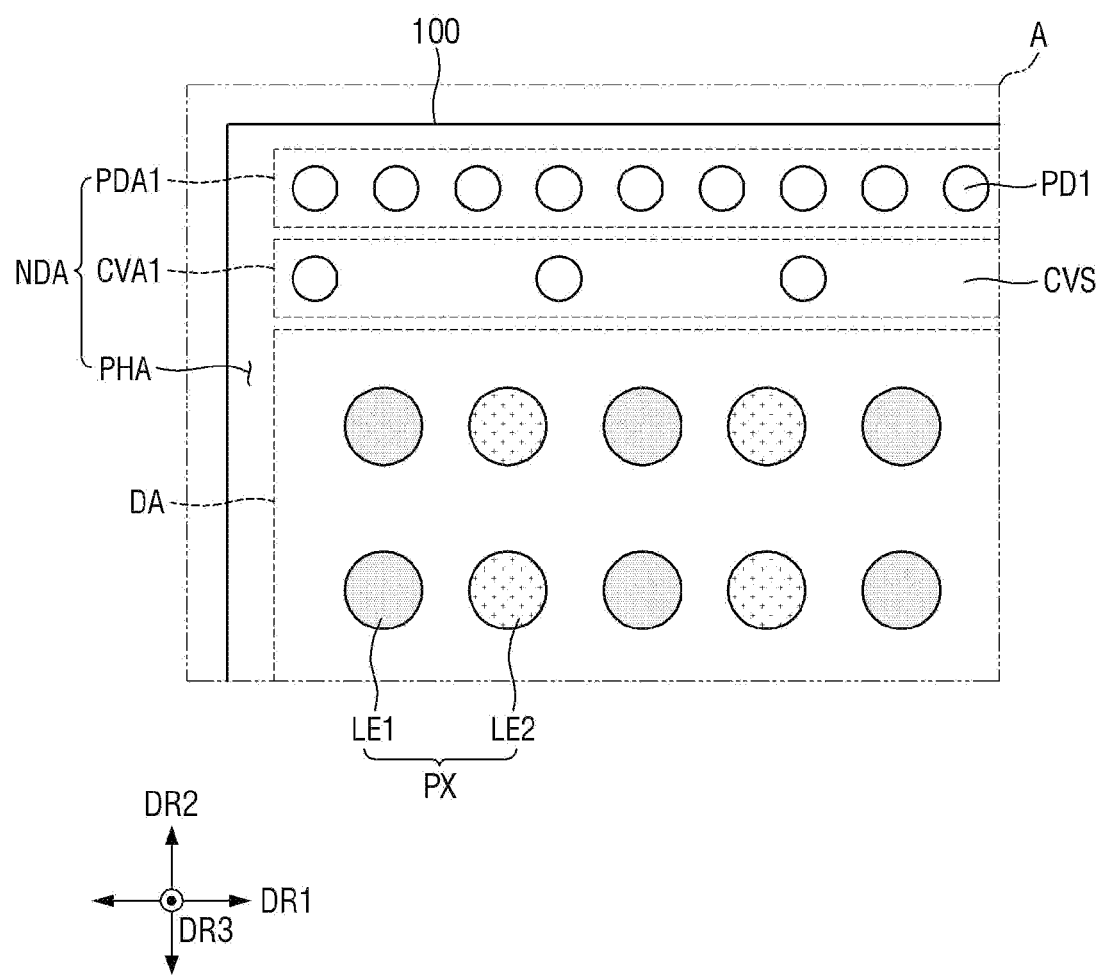
FIG. 16B is a layout diagram illustrating still another example of area A of FIG. 1.

Further, as shown in FIG. 16A, when the luminous efficiency of the first light emitting element LE1 is lower than (e.g., less than) that of the second light emitting element LE2, the area of the first light emitting element LE1 may be larger than the area of the second light emitting element LE2, but the present disclosure is not limited thereto. In one or more embodiments, when the luminous efficiency of the first light emitting element LE1 is similar to that of the second light emitting element LE2, as shown in FIG. 16B, the area of the first light emitting element LE1 and the area of the second light emitting element LE2 may be substantially the same. When the light emitting elements LE1 and LE2 have substantially the same area, the light emitting elements LE1 and LE2 may be formed with a more uniform quality, and the manufacturing process may be facilitated. Alternatively, in one or more embodiments, when the luminous efficiency of the second light emitting element LE2 is lower than (e.g., less than) that of the first light emitting element LE1, the area of the second light emitting element LE2 may be greater than the area of the first light emitting element LE1.

Figure 17:
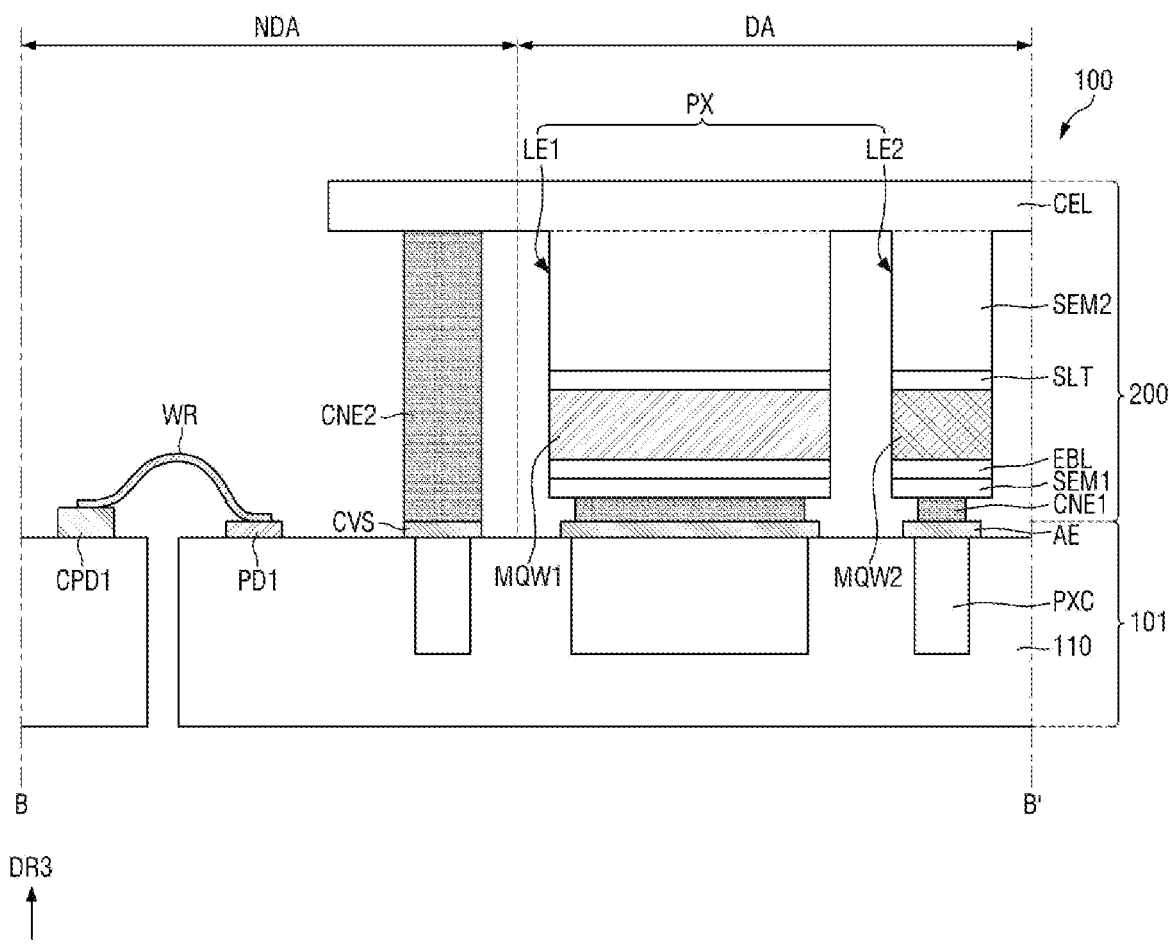
FIG. 17 is a cross-sectional view illustrating an example of a display panel taken along line B-B' of FIG. 16A.

FIG. 17 is a cross-sectional view illustrating an example of a display panel taken along line B-B' of FIG. 16A.

The embodiments corresponding to FIG. 17 are different from the embodiments corresponding to FIG. 3 in that the first light emitting element LE1 includes a first active layer MQW1, whereas the second light emitting element LE2 includes a second active layer MQW2. In FIG. 17, differences from the embodiments corresponding to FIG. 3 will be mainly described.

The first light emitting element LE1 may include the first semiconductor layer SEM1, the electron blocking layer EBL, the first active layer MQW1, the superlattice layer SLT, and the second semiconductor layer SEM2, and the second light emitting element LE2 may include the first semiconductor layer SEM1, the electron blocking layer EBL, the second active layer MQW2, the superlattice layer SLT, and the second semiconductor layer SEM2. Because the first semiconductor layer SEM1, the electron blocking layer EBL, the superlattice layer SLT, and the second semiconductor layer SEM2 are substantially the same as those described with reference to FIG. 3, a description thereof will be omitted.

When the active layers MQW1 and MQW2 are made of InGaN, the color of light emitted from the active layers MQW1 and MQW2 may vary depending on the content of indium (In). For example, as the content of indium (In) increases, the wavelength band of the light emitted from the active layer is shifted to the red wavelength band, and as the content of indium (In) decreases, the wavelength band of the light emitted from the active layer may be shifted to the blue wavelength band.

The content of indium (In) in the first active layer MQW1 may be higher than the content of indium (In) in the second active layer MQW2. For example, the content of indium (In) in the first active layer MQW1 may be about 30% to about 45%, and the content of indium (In) in the second active layer MQW2 may be about 10% to 20%. In this case, the first active layer MQW1 may emit the first light or the second light depending on the current density, and the second active layer MQW2 may emit the third light.

As shown in FIG. 17, each of the plurality of pixels PX of the display panel 100 includes the first light emitting element LE1 that emits any one of the first light and the second light depending on the current density, and the second light emitting element LE2 that emits the third light, so that various colors may be displayed without the wavelength conversion layer.

Figure 18:
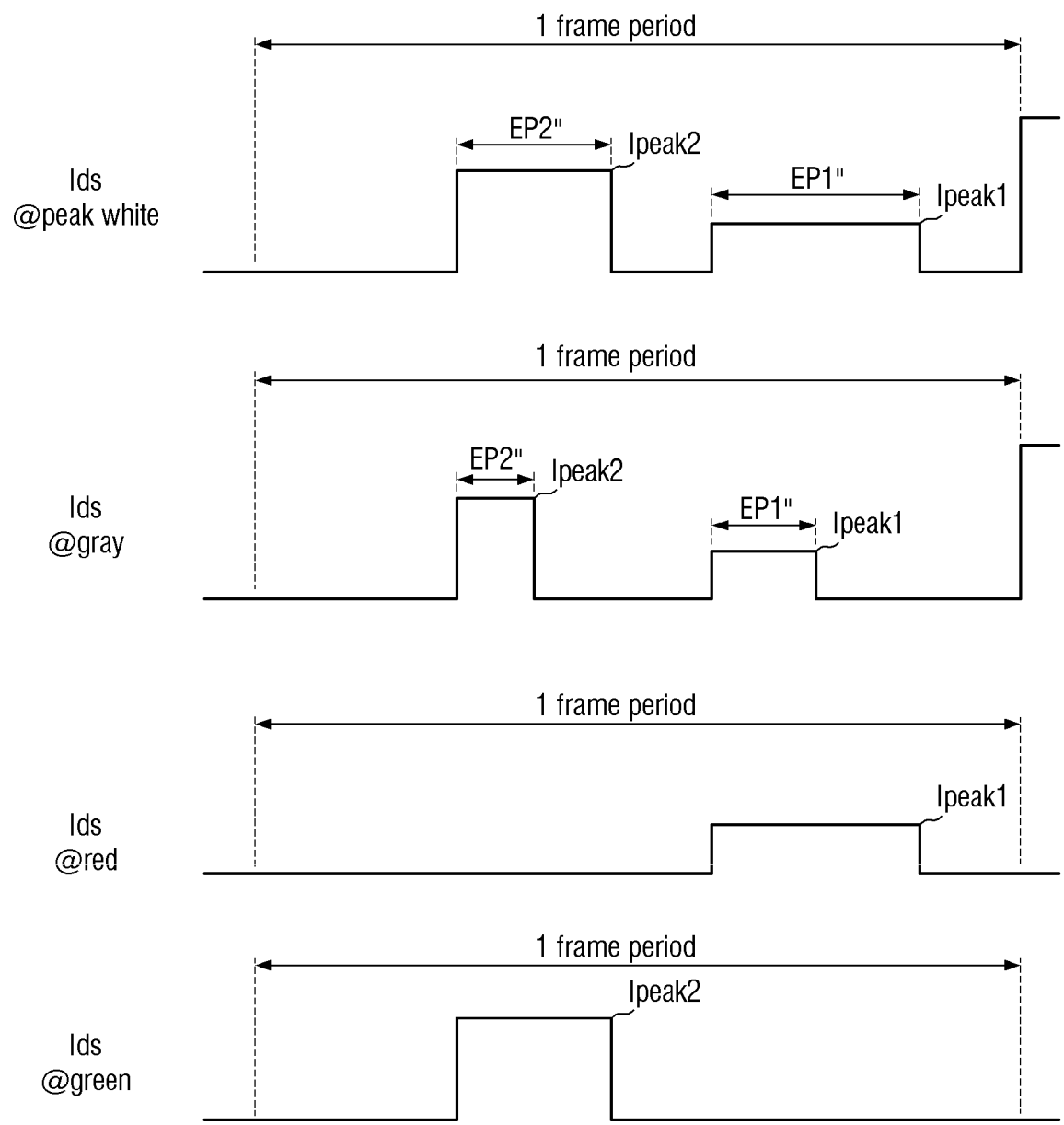
FIG. 18 is a waveform diagram illustrating a first driving current and a second driving current according to one or more embodiments.

FIG. 18 is a waveform diagram illustrating a first driving current and a second driving current according to one or more embodiments.

FIG. 18 illustrates a first driving current Ids1 applied to the light emitting element LE during one frame period. FIG. 18 shows the first driving current Ids1 applied to the light emitting element LE in each of the case where the pixel PX expresses the peak white grayscale, the case where the pixel PX expresses the grayscale, the case where the pixel PX emits the red light, and the case where the pixel PX emits the green light. The peak white grayscale indicates the brightest grayscale that may be expressed by the pixel PX.

Referring to FIG. 18, one frame period may include a first period EP1" and a second period EP2". Although FIG. 18 illustrates that the first period EP1" and the second period EP2" are arranged in the order of the second period EP2" and the first period EP1" in one frame period, but the present disclosure is not limited thereto.

The first driving current Ids1 may be time-divided and applied to the light emitting element LE during one frame period. For example, the first driving current Ids1 may be applied to the first light emitting element LE1 at the first current density during the first period EP1", and may be applied to the first light emitting element LE1 at the second current density during the second period EP2". The length of the first period EP1" and the length of the second period EP2" may be adjusted depending on the grayscale expressed by the pixel PX. For example, when the pixel PX expresses the peak white grayscale, the length of the first period EP1" and the length of the second period EP2" may be longer than those when the pixel PX expresses the grayscale. For example, as the pixel PX expresses the peak white grayscale, the length of the first period EP1" and the length of the second period EP2" may increase, and as the pixel PX expresses the peak black grayscale, the length of the first period EP1" and the length of the second period EP2" may decrease.

When the pixel PX emits the red light, the first driving current Ids1 may be applied at the first current density only during the first period EP1". Further, when the pixel PX emits the green light, the first driving current Ids1 may be applied at the second current density only during the second period EP2". Further, because the second current density is higher than the first current density, when the pixel PX expresses the peak white grayscale, the length of the first period EP1 may be longer than the length of the second period EP2.

Because the current density of the driving current Ids increases as the peak current value of the driving current Ids increases, the second peak current value Ipeak2 of the driving current Ids may be higher than the first peak current value Ipeak1.

Meanwhile, the second light emitting element LE2 may emit light depending on the second driving current. The grayscale expression of the second light emitting element LE2 may be similar to that of the first light emitting element LE1. For example, the second driving current having the third current density may be applied to the second light emitting element LE2 during one frame period. The length of the period in which the second driving current is applied may be adjusted depending on the grayscale to be expressed by the pixel PX. For example, when the pixel PX expresses the peak white grayscale, the length of the period in which the second driving current is applied may be longer than that when the pixel PX expresses the grayscale. The length of the period in which the second driving current is applied may increase as the pixel PX expresses the peak white grayscale, and the length of the period in which the second driving current is applied may increase as the pixel PX expresses the peak black grayscale.

Alternatively, the grayscale of the second light emitting element LE2 may be adjusted depending on the current density of the second driving current. For example, the second light emitting element LE2 may express the grayscale close to the peak white grayscale as the third current density of the second driving current increases, and may express the grayscale close to the peak black grayscale as the third current density of the second driving current decreases.

As described above, when the first active layer MQW1 of the first light-emitting element LE1 is made of InGaN having an indium (In) content of about 30% to about 45%, the first light emitting element LE1 may perform time division to emit the first light and the second light by performing time division on the driving current Ids1 applied to the first active layer MQW1, and by applying it the first light emitting element LE1.

Figure 19:
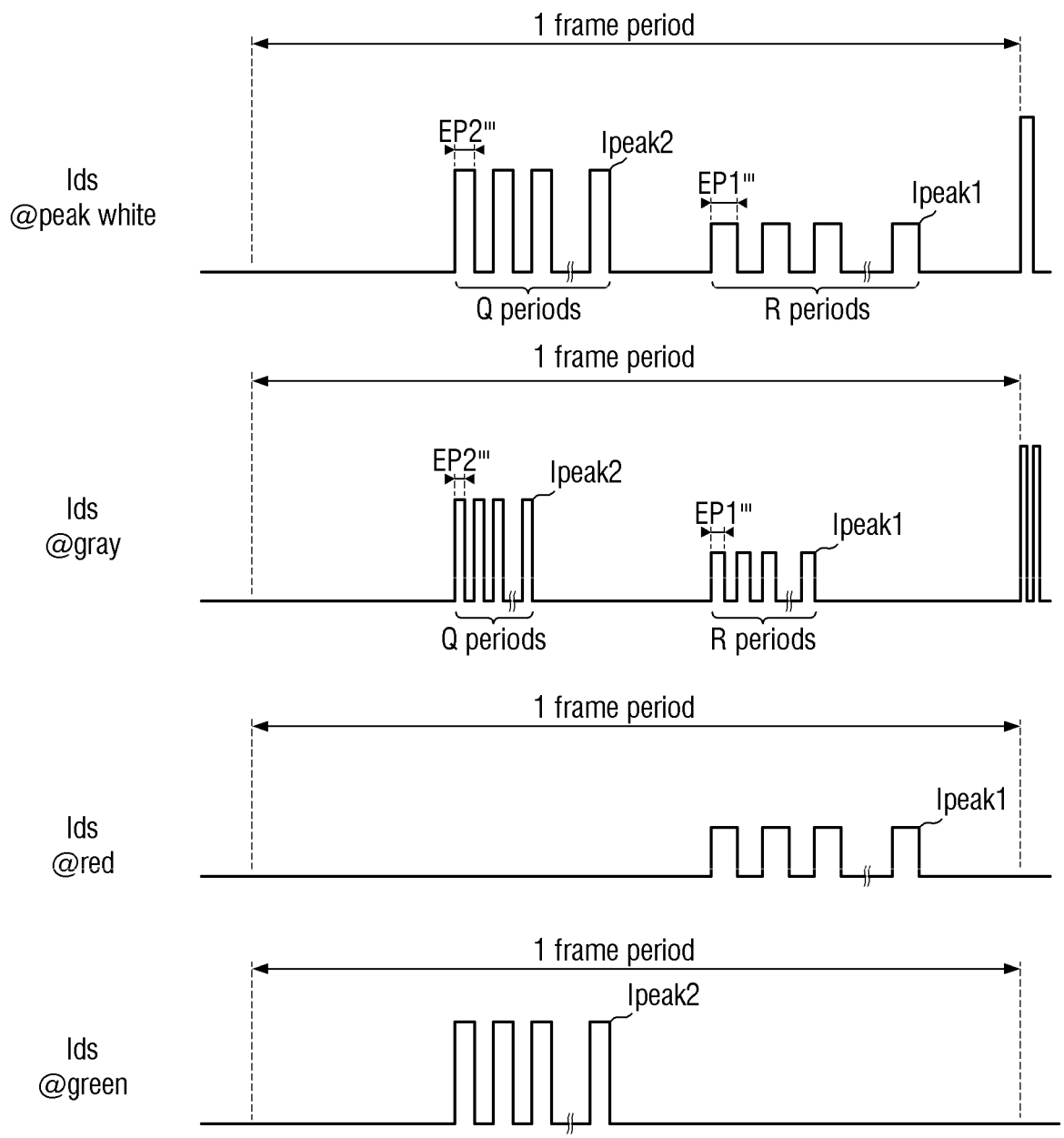
FIG. 19 is a waveform diagram illustrating a first driving current and a second driving current according to one or more other embodiments.

FIG. 19 is a waveform diagram illustrating a first driving current and a second driving current according to one or more other embodiments.

The embodiments corresponding to FIG. 19 are different from the embodiments corresponding to FIG. 18 in that the first driving current Ids is applied to the first light emitting element LE1 over a plurality of first emission periods EP1''' and a plurality of second emission periods EP2''' during one frame period. In FIG. 19, the differences from the embodiments corresponding to FIG. 18 will be mainly described.

Referring to FIG. 19, one frame period may include R first emission periods EP1''' and Q second emission periods EP2'''. The lengths of the R first periods EP1''' may be substantially the same. The lengths of the Q second emission periods EP2''' may be substantially the same.

The length of the first period EP1''' and the length of the second period EP2''' may be adjusted depending on the grayscale expressed by the pixel PX. For example, when the pixel PX expresses the peak white grayscale, the length of the first period EP1''' and the length of the second period EP2''' may be longer than those when the pixel PX expresses the grayscale. The length of the first period EP1''' and the length of the second period EP2''' may increase as the pixel PX expresses the peak white grayscale, and may decrease as the pixel PX expresses the peak black grayscale.

When the pixel PX emits the red light, the first driving current Ids1 may be applied at the first current density only during the R first periods EP1'''. Further, when the pixel PX emits the green light, the first driving current Ids1 may be applied at the second current density only during the Q second periods EP2'''.

Because the second current density is higher than the first current density, the length of the first period EP1''' may be longer than the length of the second period EP2''' when the pixel PX expresses the peak white grayscale. Further, when the pixel PX expresses the peak white grayscale, the sum of the R first periods EP1''' may be longer than the sum of the Q second periods EP2''' during one frame period.

Figure 20:
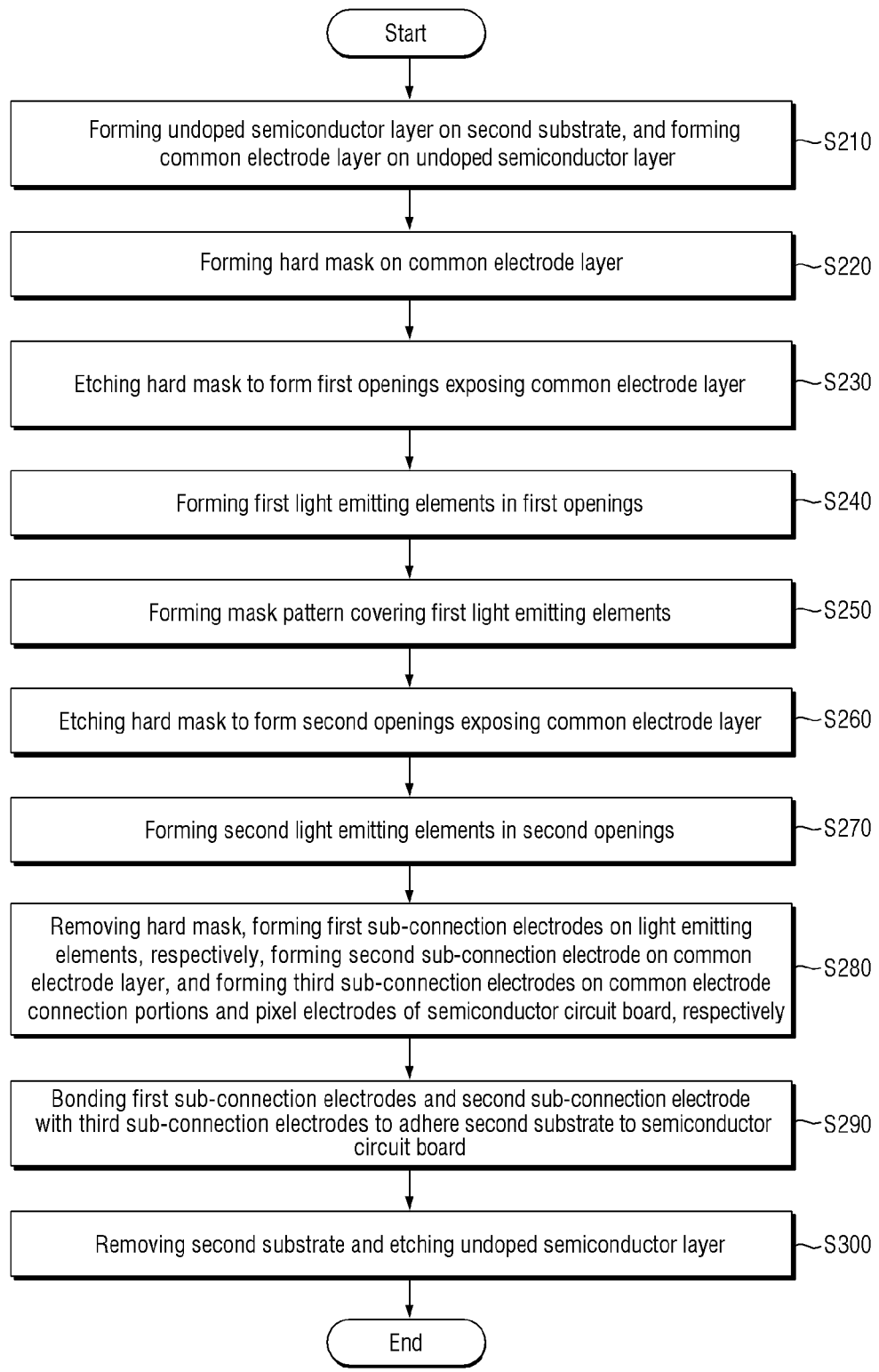
FIG. 20 is a flowchart illustrating a method for fabricating a display device according to still one or more other embodiments.

FIG. 20 is a flowchart illustrating a method for fabricating a display device according to still one or more other embodiments. FIGS. 21 to 28 are cross-sectional views illustrating a method for fabricating a display device according to one or more embodiments.

Hereinafter, a method for fabricating a display device according to still one or more other embodiments will be described in detail with reference to FIGS. 20 to 28.

Operations S210 and S220 of FIG. 20 are substantially the same as operations S110 and S120 of FIG. 8, respectively, so that a description thereof will be omitted.

Figure 21:
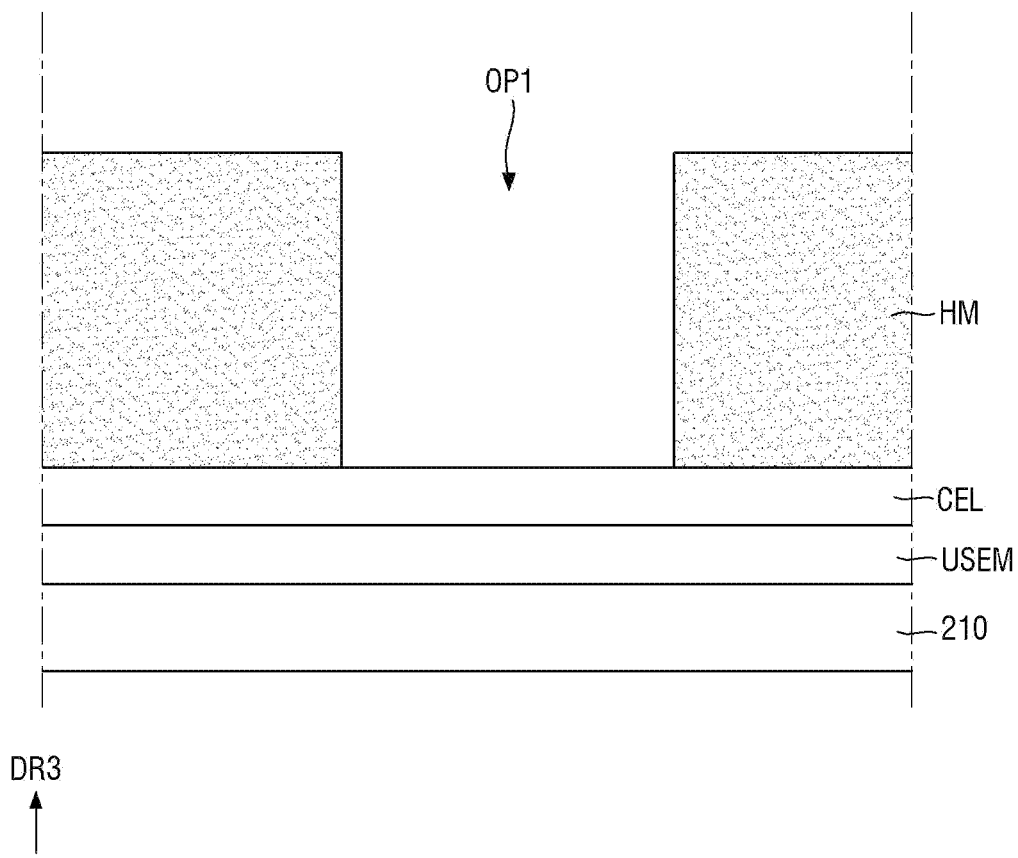
FIGS. 21 to 28 are cross-sectional views illustrating a method for fabricating a display device according to one or more embodiments.

First, as shown in FIG. 21, the hard mask HM is etched to form the plurality of first openings OP1 exposing the common electrode layer CEL (operation S230 in FIG. 20).

In one or more embodiments in the drawing, a separate mask is located on the hard mask HM except the region where the plurality of first openings OP1 will be formed, and the plurality of first openings OP1 may be formed by performing wet etching or dry etching of the hard mask HM.

The plurality of first openings OP1 may be formed to be spaced apart from each other. The gap and width of the plurality of first openings OP1 may be set in consideration of the arrangement and width of the first light emitting elements LE1.

Figure 22:
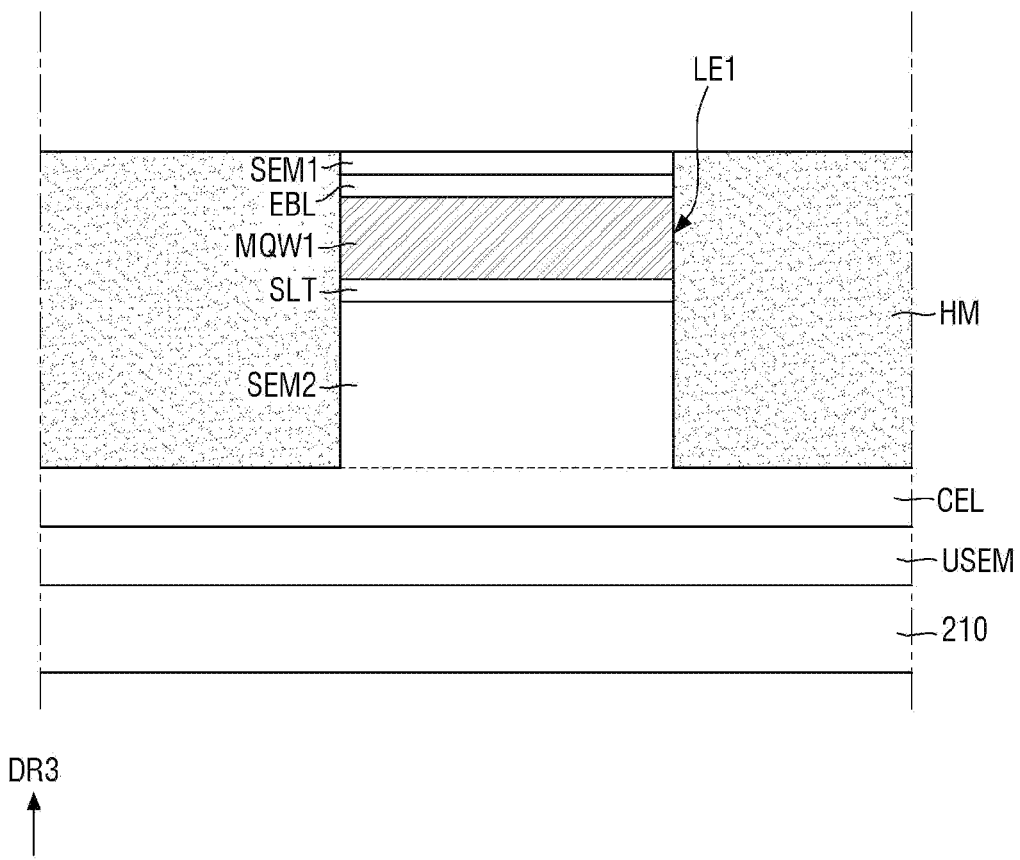

Then, as shown in FIG. 22, the first light emitting elements LE1 are formed in the plurality of first openings OP1 (operation S240 in FIG. 20).

The process of forming the first light emitting elements LE1 may be performed by the epitaxial growth method. When the top surface of the common electrode layer CEL is exposed by the plurality of first openings OP1, a semiconductor crystal is grown by injecting a precursor material onto the common electrode layer CEL. The second semiconductor layer SEM2 of each of the first light emitting elements LE1 located on the common electrode layer CEL may contain substantially the same material as that of the common electrode layer CEL, and may be formed by the growth of the semiconductor crystal of the common electrode layer CEL. Accordingly, the second semiconductor layer SEM2 of each of the first light emitting elements LE1 and the common electrode layer CEL may be integrated.

Next, the superlattice layer SLT, the first active layer MQW1, the electron blocking layer EBL, and the first semiconductor layer SEM1 are sequentially grown to complete the first light emitting elements LE1.

Figure 23:
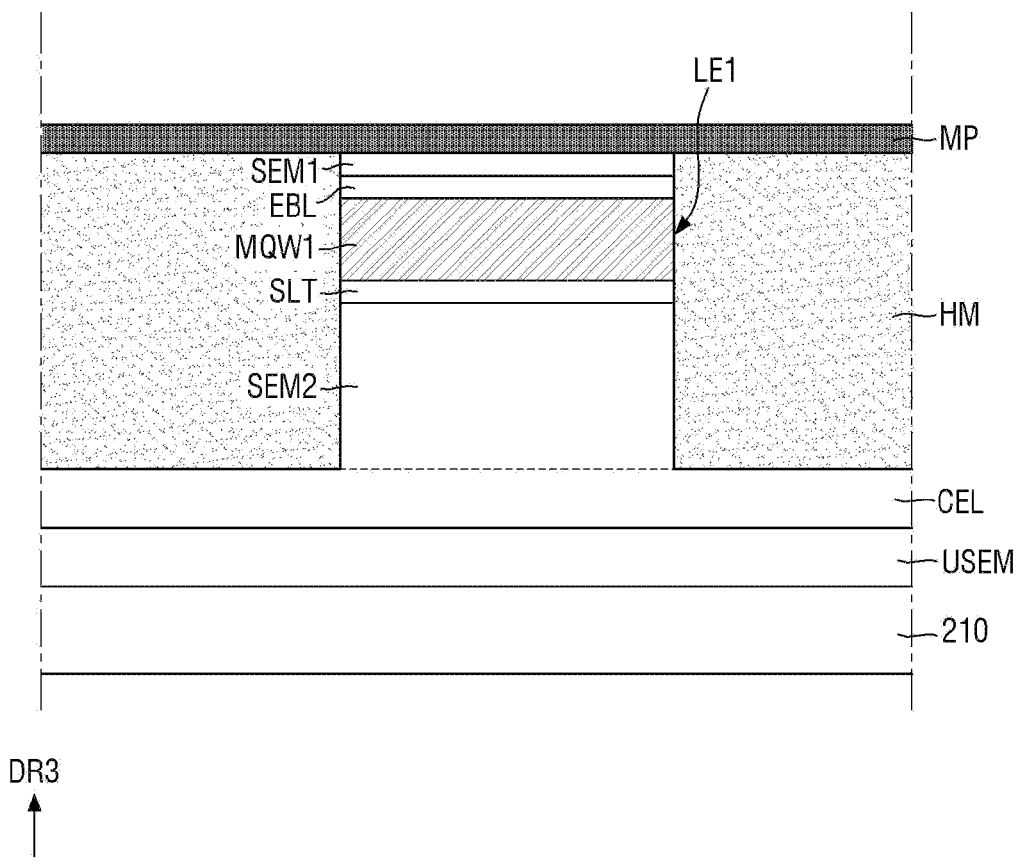

Then, as shown in FIG. 23, a mask pattern MP covering the first light emitting elements LE1 is formed (operation S250 in FIG. 20).

The mask pattern MP may be formed of an inorganic layer such as a silicon oxide layer ($SiO_2$), an aluminum oxide layer ($Al_2O_3$), or a hafnium oxide layer ($HfO_x$), but the present disclosure is not limited thereto. The mask pattern MP may contain the same material as that of the hard mask HM.

The mask pattern MP may be a protective layer or a barrier layer for protecting the first light emitting elements LE1. The mask pattern MP may be located to cover each of the first light emitting elements LE1. Further, the mask pattern MP may be located to cover the entire top surface of the hard mask HM.

Figure 24:
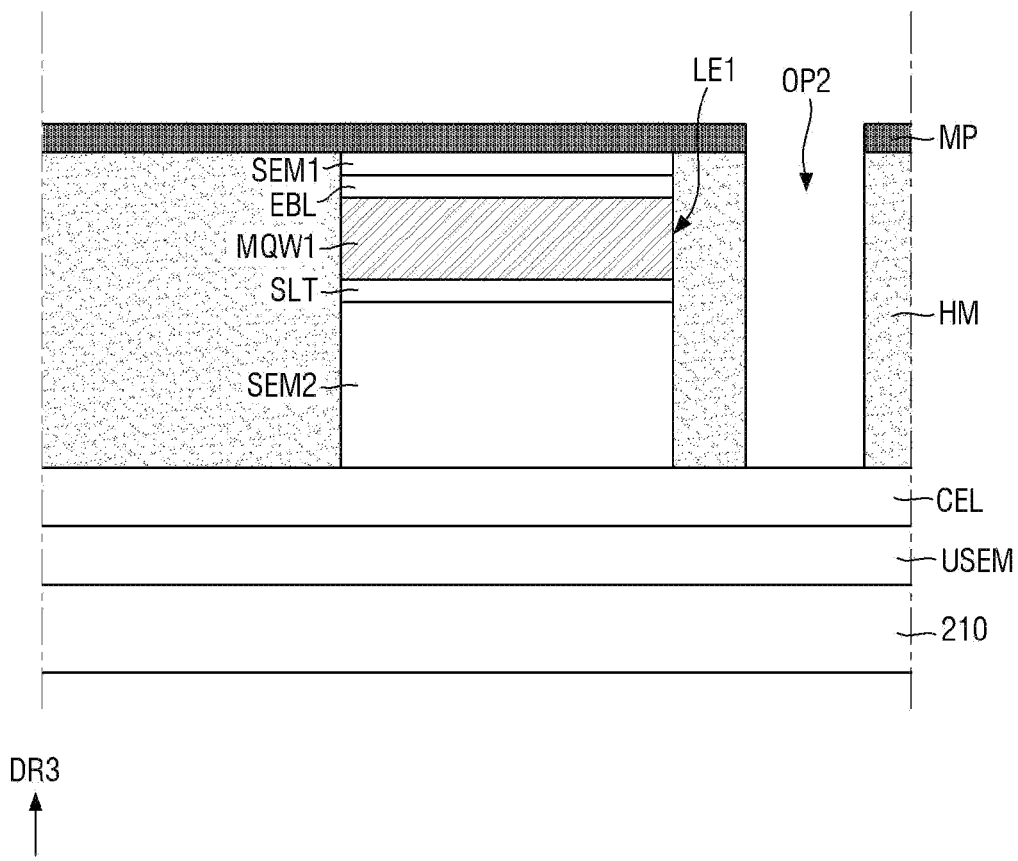

Then, as shown in FIG. 24, the hard mask HM is etched to form a plurality of second openings OP2 exposing the common electrode layer CEL (operation S260 in FIG. 20).

In one or more embodiments in the drawing, a separate mask is located on the hard mask HM except the region where the plurality of second openings OP2 will be formed, and the plurality of second openings OP2 may be formed by performing wet etching or dry etching of the hard mask HM.

The plurality of second openings OP2 may be formed to be spaced apart from each other. The gap and width of the plurality of second openings OP2 may be set in consideration of the arrangement and width of the second light emitting elements LE2.

Figure 25:
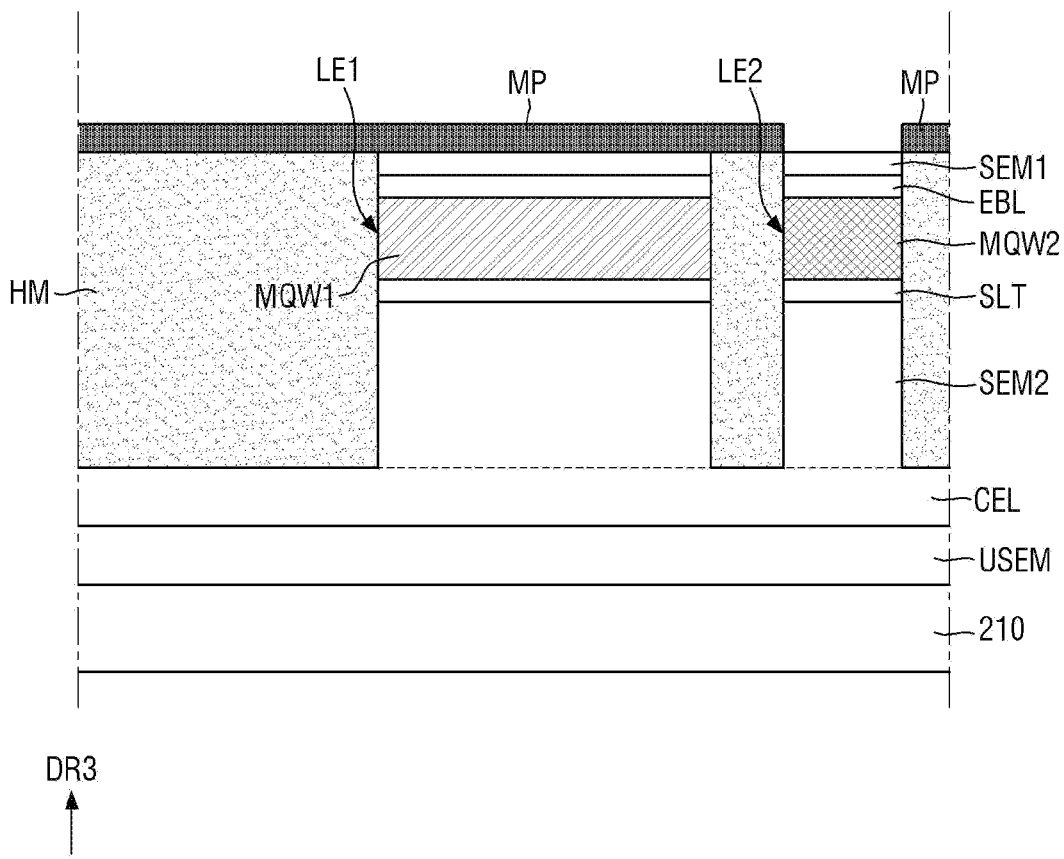

Thereafter, as shown in FIG. 25, the second light emitting elements LE2 are formed in the plurality of second openings OP2 (operation S270 of FIG. 20).

The process of forming the second light emitting elements LE2 may be performed by the epitaxial growth method. When the top surface of the common electrode layer CEL is exposed by the plurality of second openings OP2, a semiconductor crystal is grown by injecting a precursor material onto the common electrode layer CEL. The second semiconductor layer SEM2 of each of the second light emitting elements LE2 located on the common electrode layer CEL may contain substantially the same material as that of the common electrode layer CEL, and may be formed by the growth of the semiconductor crystal of the common electrode layer CEL. Accordingly, the second semiconductor layer SEM2 of each of the second light emitting elements LE2 and the common electrode layer CEL may be integrated.

Next, the superlattice layer SLT, the second active layer MQW2, the electron blocking layer EBL, and the first semiconductor layer SEM1 are sequentially grown to complete the second light emitting elements LE2.

Figure 26:
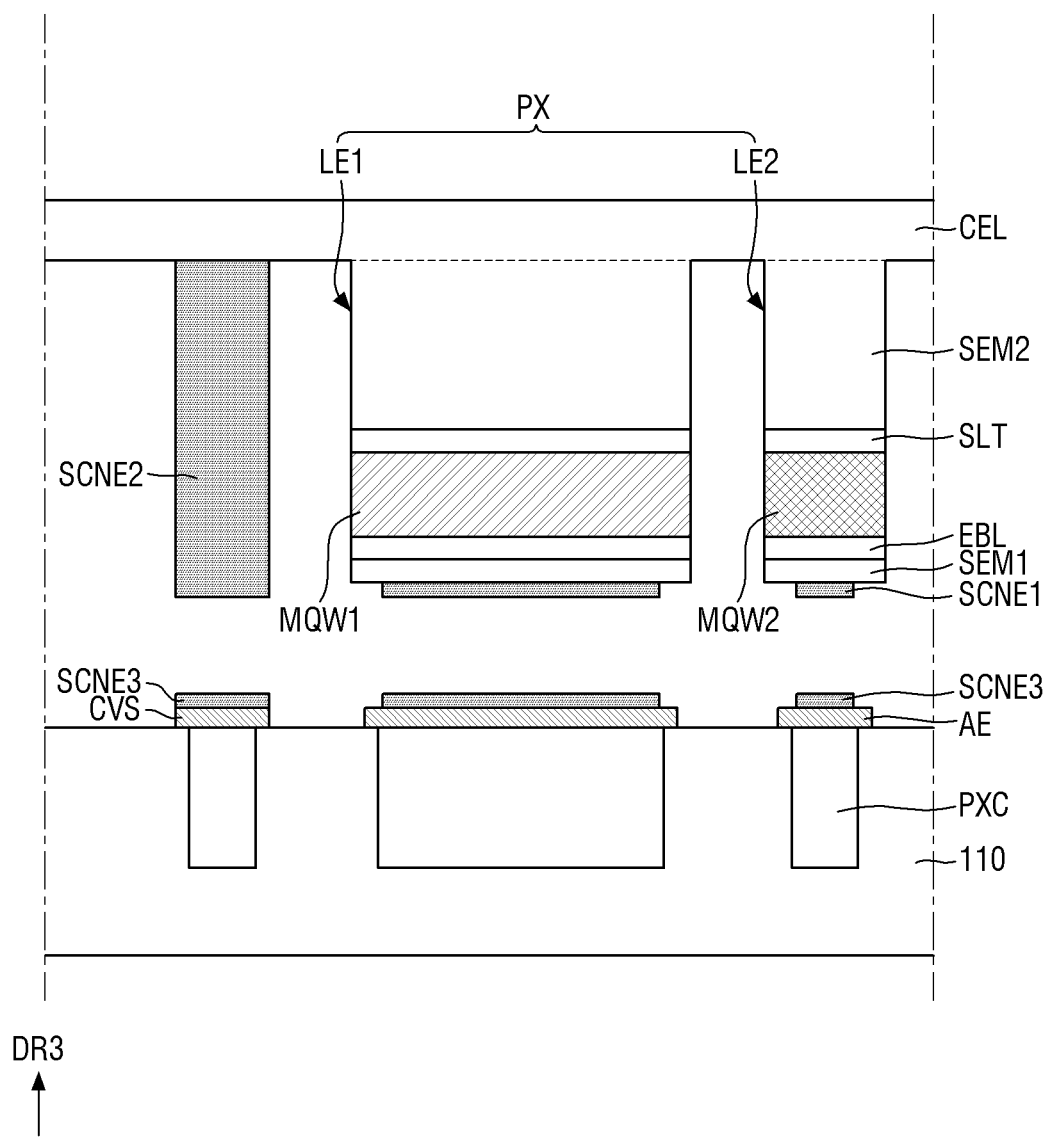

Then, as shown in FIG. 26, the hard mask HM and the mask pattern MP are etched, the first sub-connection electrodes SCNE1 are respectively formed on the light emitting elements LE1 and LE2, the second sub-connection electrode SCNE2 is formed on the common electrode layer CEL, and the third sub-connection electrodes SCNE3 are respectively formed on the pixel electrodes AE and the common electrode connection portions CVS of the semiconductor circuit board 101 (operation S280 in FIG. 20).

The hard mask HM and the mask pattern MP may be etched at one time by the etching process. The etching process may be dry etching, wet etching, reactive ion etching (RIE), deep reactive ion etching (DRIE), inductively coupled plasma reactive ion etching (ICP-RIE), or the like.

Then, the first sub-connection electrode SCNE1 may be formed on the top surface of the first semiconductor layer SEM1 of each of the light emitting elements LE1 and LE2 by the photolithography process.

Further, the second sub-connection electrode SCNE2 may be formed on the common electrode layer CEL by the photolithography process.

Furthermore, the third sub-connection electrodes SCNE3 may be respectively formed on the pixel electrodes AE and the common electrode connection portions CVS of the semiconductor circuit board 101 by the photolithography process.

The first sub-connection electrodes SCNE1, the second sub-connection electrode SCNE2, and the third sub-connection electrodes SCNE3 may serve as a bonding metal. For example, the first sub-connection electrodes SCNE1, the second sub-connection electrode SCNE2, and the third sub-connection electrodes SCNE3 may contain at least one of gold (Au), copper (Cu), aluminum (Al), or tin (Sn), or may contain a transparent conductive oxide such as indium tin oxide (ITO) or indium zinc oxide (IZO).

Figure 27:
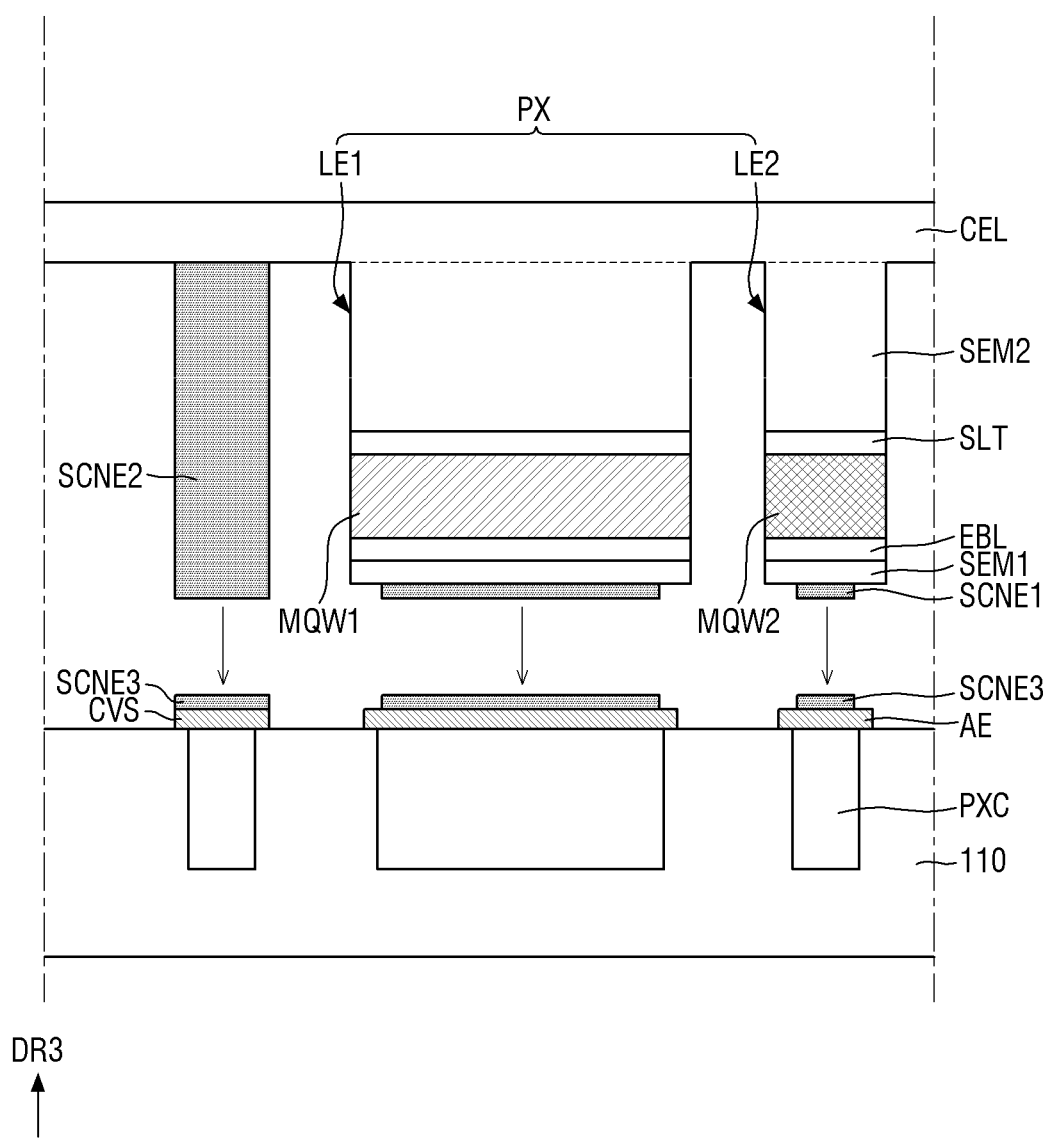

Then, as shown in FIG. 27, the first sub-connection electrodes SCNE1 and the second sub-connection electrode SCNE2 may be respectively bonded with the third sub-connection electrodes SCNE3 to adhere the second substrate 210 to the semiconductor circuit board 101 (operation S290 in FIG. 20).

The first sub-connection electrodes SCNE1 of the second substrate 210 may be aligned to correspond to the pixel electrodes AE of the semiconductor circuit board 101, respectively. Further, the second sub-connection electrode SCNE2 of the second substrate 210 may be aligned to correspond to the common electrode connection portion CVS of the semiconductor circuit board 101. That is, the first sub-connection electrodes SCNE1 of the second substrate 210 may overlap the pixel electrodes AE of the semiconductor circuit board 101 in the third direction DR3, respectively. The second sub-connection electrode SCNE2 of the second substrate 210 may overlap the common electrode connection portions CVS of the semiconductor circuit board 101 in the third direction DR3.

Then, the first sub-connection electrodes SCNE1 and the second sub-connection electrode SCNE2 of the second substrate 210 are respectively brought into contact with the third sub-connection electrodes SCNE3 of the semiconductor circuit board 101. Then, the first sub-connection electrodes SCNE1, the second sub-connection electrode SCNE2, and the third sub-connection electrodes SCNE3 are fusion-bonded at a temperature (e.g., a predetermined temperature). Accordingly, the second substrate 210 may be adhered to the semiconductor circuit board 101.

Figure 28:
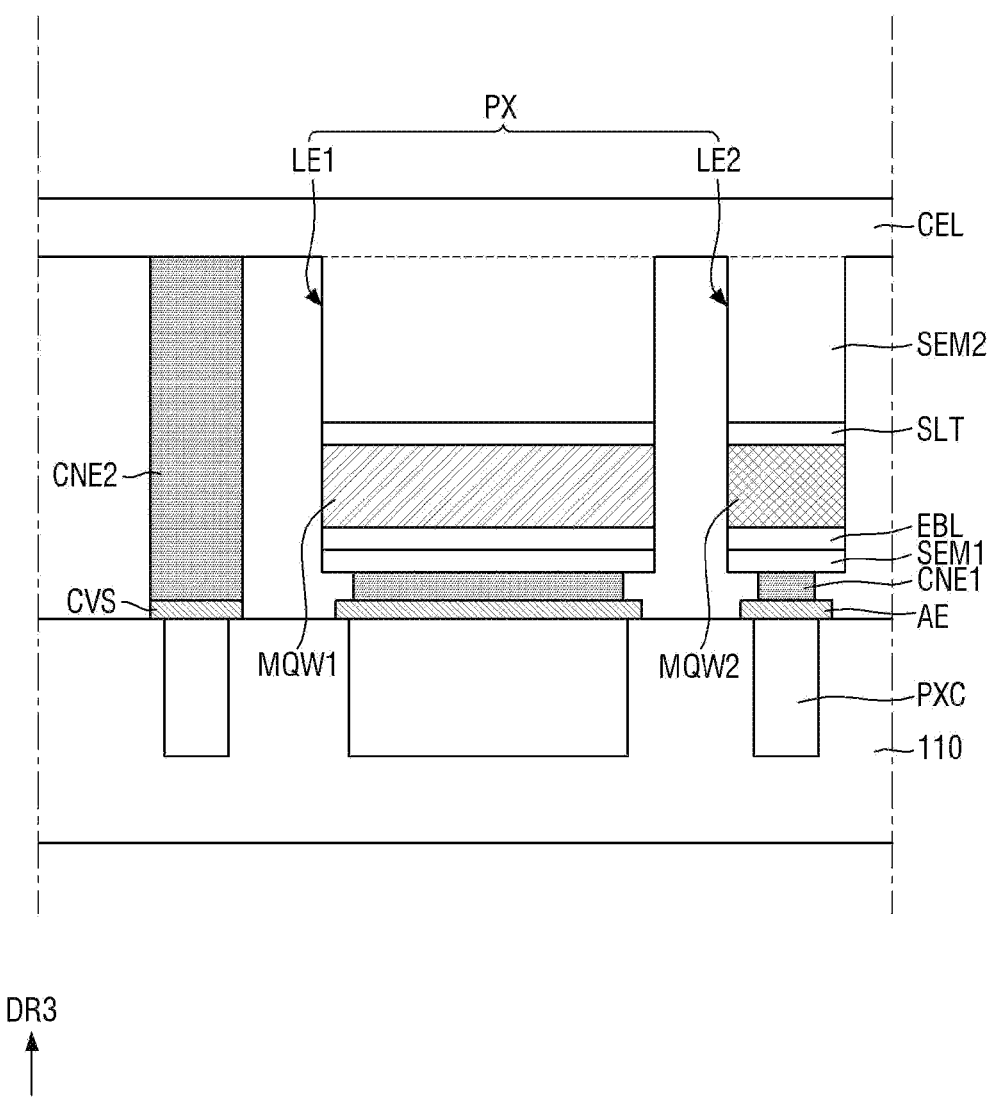

Then, as shown in FIG. 28, the second substrate 210 is removed, and the undoped semiconductor layer USEM is etched (operation S300 in FIG. 20).

The second substrate 210 may be separated from the undoped semiconductor layer USEM by the laser lift-off process. Alternatively, the second substrate 210 may be removed by a polishing process such as a chemical mechanical polishing (CMP) process and/or an etching process.

The undoped semiconductor layer USEM may be removed by the polishing process such as the CMP process, or may be removed by wet etching or dry etching. When the undoped semiconductor layer USEM is removed, a part of the common electrode layer CEL may be removed.

As described above, the pixel PX includes the first light emitting element LE1 that emits any one of the first light and the second light depending on the current density, and the second light emitting element LE2 that emits the third light. Accordingly, it is possible to simplify the manufacturing process, and to reduce the manufacturing cost compared to the case of separately forming the first light emitting elements that emit the first light, the second light emitting elements that emit the second light, and the third light emitting elements that emit the third light.

Figure 29:
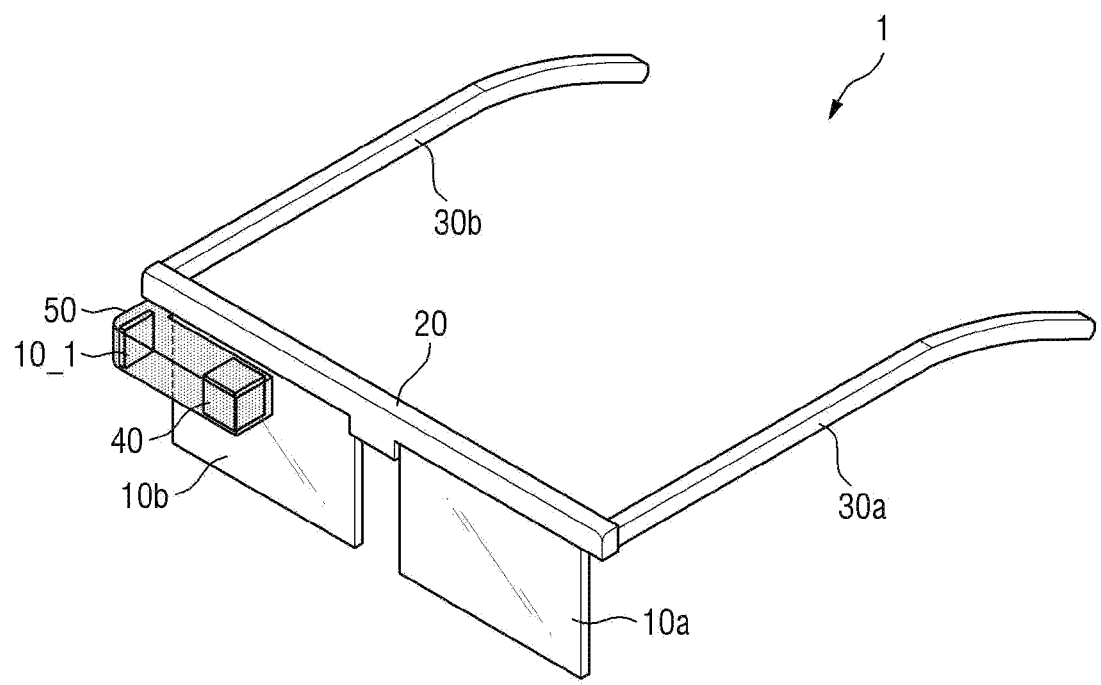
FIG. 29 is a diagram illustrating a virtual reality device including a display device according to one or more embodiments.

FIG. 29 is a diagram illustrating a virtual reality device including a display device according to one or more embodiments. FIG. 29 illustrates a virtual reality device 1 to which a display device 10_1 according to one or more embodiments is applied.

Referring to FIG. 29, the virtual reality device 1 according to one or more embodiments may be a glass-type device. The virtual reality device 1 according to one or more embodiments may include the display device 10_1, a left lens 10a, a right lens 10b, a support frame 20, temples 30a and 30b, a reflection member 40, and a display device storage 50.

Although FIG. 29 illustrates the virtual reality device 1 including the temples 30a and 30b, the virtual reality device 1 according to one or more embodiments may be applied to a head mounted display including a head mounted band that may be worn on a head, instead of the temples 30a and 30b. That is, the virtual reality device 1 according to one or more embodiments is not limited to that shown in FIG. 29, and may be applied in various forms to various electronic devices.

The display device storage 50 may include the display device 10_1 and the reflection member 40. The image displayed on the display device 10_1 may be reflected by the reflection member 40 and may be provided to a user's right eye through the right lens 10b. Accordingly, the user can view the virtual reality image displayed on the display device 10_1 through the right eye.

Although FIG. 29 illustrates that the display device storage 50 is located at the right end of the support frame 20, the present disclosure is not limited thereto. For example, the display device storage 50 may be located at the left end of the support frame 20, and in this case, the image displayed on the display device 10_1 may be reflected by the reflection member 40 and provided to a user's left eye through the left lens 10a. Accordingly, the user can view the virtual reality image displayed on the display device 10_1 through the left eye. Alternatively, the display device storage 50 may be located at both the left end and the right end of the support frame 20. In that case, the user can view the virtual reality image displayed on the display device 10_1 through both the left eye and the right eye.

Figure 30:
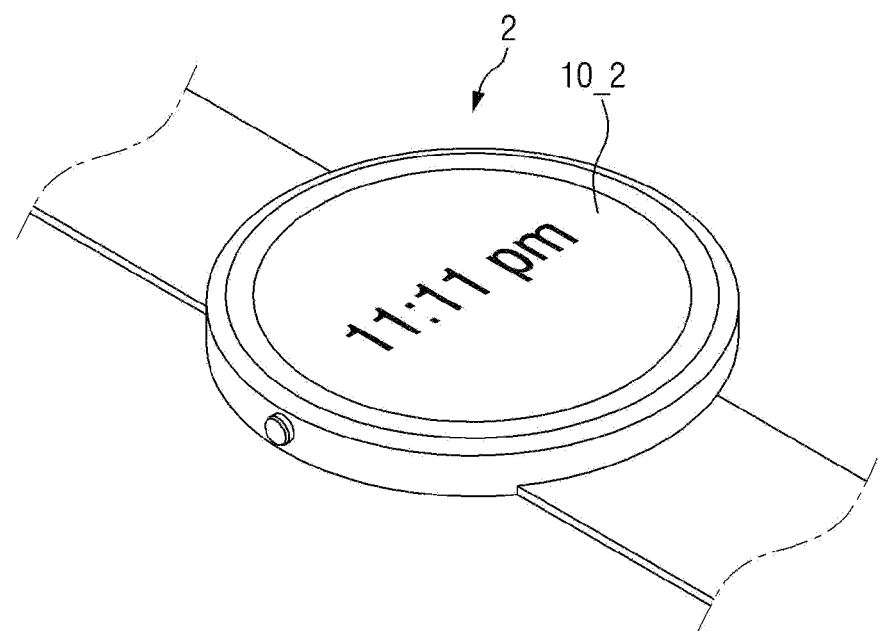
FIG. 30 is a diagram illustrating a smart device including a display device according to one or more embodiments.

FIG. 30 is a diagram illustrating a smart device including a display device according to one or more embodiments.

Referring to FIG. 30, a display device 10_2 according to one or more embodiments may be applied to a smart watch 2 that is one of the smart devices.

Figure 31:
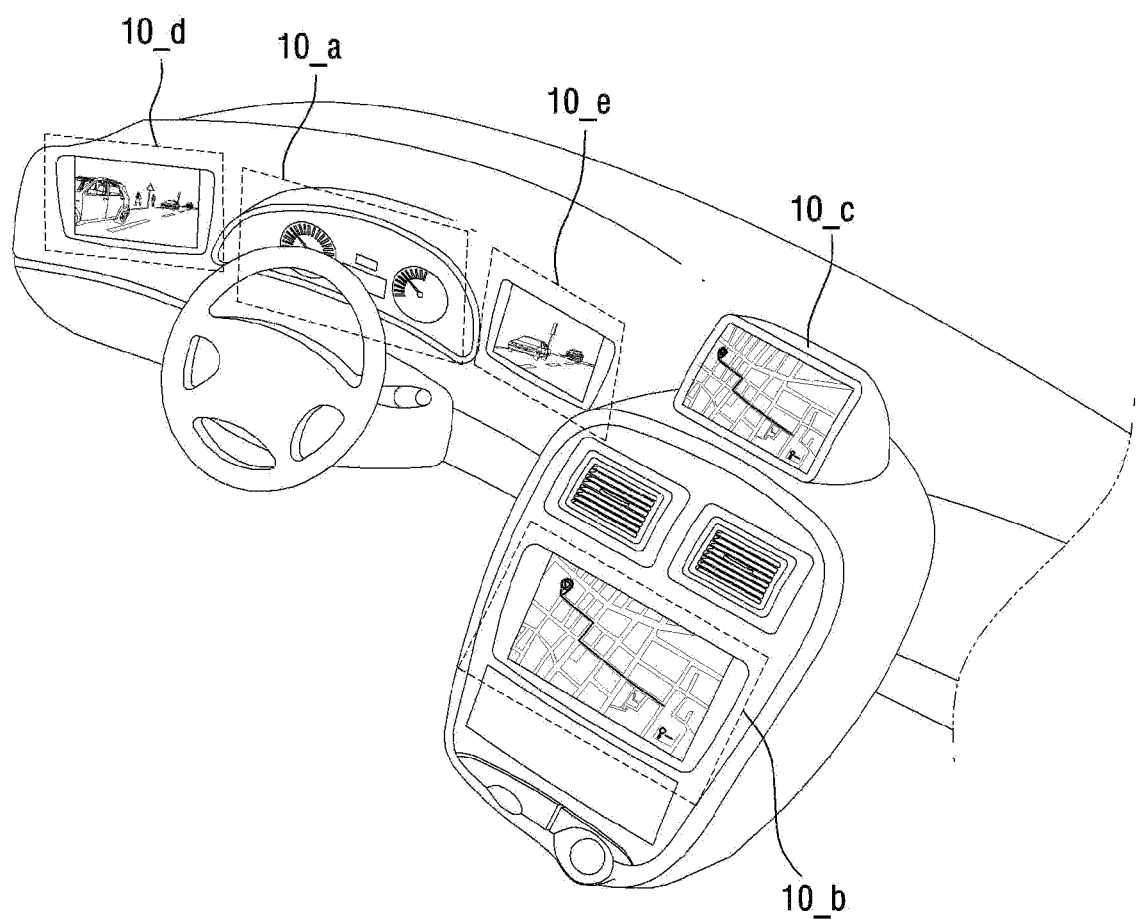
FIG. 31 is a view illustrating a dashboard of an automobile and a center fascia including a display device according to one or more embodiments.

FIG. 31 is a view illustrating a dashboard of an automobile and a center fascia including a display device according to one or more embodiments. FIG. 31 illustrates a vehicle to which display devices 10_a, 10_b, 10_c, 10_d, and 10_e according to one or more embodiments are applied.

Referring to FIG. 31, the display devices 10_a, 10_b, and 10_c according to one or more embodiments may be applied to the dashboard of the automobile, the center fascia of the automobile, or the center information display (CID) of the dashboard of the automobile. Further, the display devices 10_d, and 10_e according to one or more embodiments may be applied to a room mirror display instead of side mirrors of the automobile.

Figure 32:
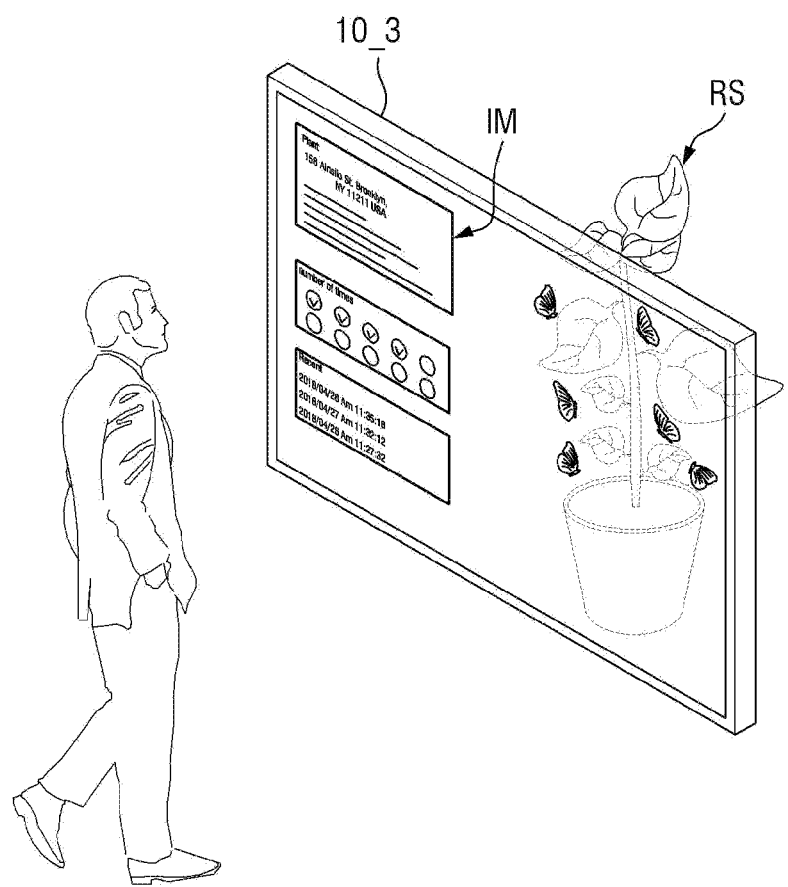
FIG. 32 is a diagram illustrating a transparent display device including a display device according to one or more embodiments.

FIG. 32 is a diagram illustrating a transparent display device including a display device according to one or more embodiments.

Referring to FIG. 32, a display device 10_3 according to one or more embodiments may be applied to the transparent display device. The transparent display device may display an image IM, and also may transmit light. Thus, a user located on the front side of the transparent display device can view an object RS or a background on or behind the rear side of the transparent display device as well as the image IM displayed on the display device 10_3. When the display device 10_3 is applied to the transparent display device, the first substrate 110 shown in FIG. 3 may include a light transmitting portion capable of transmitting light or may be made of a material capable of transmitting light.

However, the aspects of embodiments of the present disclosure are not limited to the one set forth herein. The above and other aspects and features of embodiments of the present disclosure will become more apparent to one of daily skill in the art to which the present disclosure pertains by referencing the claims, with functional equivalents thereof to be included therein.

What is claimed is:

1. A display device comprising:
 a substrate;
 a pixel electrode on the substrate;
 a light emitting element on the pixel electrode; and
 a common electrode layer on the light emitting element, and configured to receive a common voltage,
 wherein the light emitting element is configured to emit a first light according to a driving current having a first current density, is configured to emit a second light according to a driving current having a second current density, and is configured to emit a third light according to a driving current having a third current density.

2. The display device of claim 1, wherein one frame period comprises a first period, a second period, and a third period, and
 wherein the driving current is applied at the first current density during the first period, is applied at the second current density during the second period, and is applied at the third current density during the third period.

3. The display device of claim 2, wherein, when the light emitting element emits light with a peak white grayscale, a length of the first period is longer than a length of the second period, and the length of the second period is longer than a length of the third period.

4. The display device of claim 2, wherein the first current density is less than the second current density, and
 wherein the first light has a longer wavelength than the second light.

5. The display device of claim 2, wherein the second current density is less than the third current density, and
 wherein the second light has a longer wavelength than the third light.

6. The display device of claim 2, wherein the first light is light of a red wavelength band, the second light is light of a green wavelength band, and the third light is light of a blue wavelength band.

7. The display device of claim 2, wherein an active layer of the light emitting element comprises InGaN having an indium (In) content of about 30% to about 45%.

8. The display device of claim 2, wherein a first peak current value of the driving current during the first period is lower than a second peak current value of the driving current during the second period.

9. The display device of claim 2, wherein a second peak current value of the driving current during the second period is lower than a third peak current value of the driving current during the third period.

10. The display device of claim 2, wherein the first current density of the driving current is constant during the first period, the second current density of the driving current is constant during the second period, and the third current density of the driving current is constant during the third period.

11. The display device of claim 10, wherein the first period, the second period, and the third period are adjusted according to a grayscale of the light emitting element.

12. The display device of claim 1, wherein one frame period comprises R (R being an integer greater than or equal to 2) first periods, Q (Q being an integer greater than or equal to 2) second periods, and P (P being an integer greater than or equal to 2) third periods, and
wherein the driving current is applied at the first current density during the first periods, is applied at the second current density during the second periods, and is applied at the third current density during the third periods.

13. The display device of claim 12, wherein, in the one frame period, a sum of the first periods is longer than a sum of the second periods, and the sum of the second periods is longer than a sum of the third periods.

14. A display device comprising:
a substrate;
pixel electrodes on the substrate;
light emitting elements respectively on the pixel electrodes; and
a common electrode layer on the light emitting elements, and configured to receive a common voltage,
wherein each of the light emitting elements comprises:
a first light emitting element configured to emit a first light according to a first driving current having a first current density, and configured to emit a second light according to a first driving current having a second current density; and
a second light emitting element configured to emit a third light according to a second driving current.

15. The display device of claim 14, wherein one frame period comprises a first period and a second period, and
wherein the driving current is configured to be applied at the first current density during the first period, and is configured to be applied at the second current density during the second period.

16. The display device of claim 15, wherein, when the first light emitting element emits light with a peak luminance, a length of the first period is longer than a length of the second period.

17. The display device of claim 16, wherein the first current density is less than the second current density, and the first light has a longer wavelength than the second light.

18. The display device of claim 14, wherein an area of the first light emitting element is larger than an area of the second light emitting element.

19. The display device of claim 14, wherein an active layer of the first light emitting element comprises InGaN having an indium (In) content of about 30% to about 45%, and
wherein an active layer of the second light emitting element comprises InGaN having an indium (In) content of 10% to 20%.

20. A method for fabricating a display device, comprising:
forming a common electrode layer on a substrate;
forming a hard mask on the common electrode layer;
etching the hard mask to form openings exposing the common electrode layer;
forming light emitting elements in the openings, respectively;
removing the hard mask;
forming first connection electrodes on the light emitting elements, respectively;
forming second connection electrodes on pixel electrodes of a semiconductor circuit board, respectively; and
bonding the first connection electrodes to the second connection electrodes,
wherein an active layer of each of the light emitting elements comprises InGaN having an indium (In) content of about 30% to about 45%.

* * * * *